United States Patent
Suzuki

(10) Patent No.: US 10,712,666 B2
(45) Date of Patent: Jul. 14, 2020

(54) EXTREME ULTRAVIOLET LIGHT GENERATION DEVICE

(71) Applicant: GIGAPHOTON INC., Tochigi (JP)

(72) Inventor: Toru Suzuki, Oyama (JP)

(73) Assignee: Gigaphoton Inc., Tochigi (JP)

(*) Notice: Subject to any disclaimer, the term of this patent is extended or adjusted under 35 U.S.C. 154(b) by 67 days.

(21) Appl. No.: 16/028,896

(22) Filed: Jul. 6, 2018

(65) Prior Publication Data

US 2018/0314161 A1 Nov. 1, 2018

Related U.S. Application Data

(63) Continuation of application No. PCT/JP2016/055854, filed on Feb. 26, 2016.

(51) Int. Cl.
*H04N 5/232* (2006.01)
*G03F 7/20* (2006.01)
(Continued)

(52) U.S. Cl.
CPC ........ *G03F 7/70033* (2013.01); *G03F 7/2004* (2013.01); *G03F 7/2006* (2013.01);
(Continued)

(58) Field of Classification Search
CPC .................. G03F 7/70033; H04N 5/23299
See application file for complete search history.

(56) References Cited

U.S. PATENT DOCUMENTS

2006/0192154 A1* 8/2006 Algots ................... H05G 2/003
250/504 R
2010/0258750 A1* 10/2010 Partlo ................... H05G 2/006
250/504 R
(Continued)

FOREIGN PATENT DOCUMENTS

JP 2008-532286 A 8/2008
JP 2014-086523 A 5/2014
(Continued)

OTHER PUBLICATIONS

International Search Report issued in PCT/JP2016/055854; dated May 24, 2016.
(Continued)

*Primary Examiner* — Rowina J Cattungal
(74) *Attorney, Agent, or Firm* — Studebaker & Brackett PC

(57) ABSTRACT

An extreme ultraviolet light generation device includes: a target supply unit outputting a plurality of targets along a trajectory toward a plasma generation region; a laser device emitting laser light toward the plasma generation region; an image capturing unit having an image capturing direction non-orthogonal and non-parallel to the trajectory, capturing an image of a region including the plasma generation region, and outputting image data; an illumination unit outputting illumination light to the region including the plasma generation region; an image capturing position change unit changing an image capturing position of the image capturing unit along the image capturing direction; a movement amount determination unit determining an movement amount of the image capturing position based on the image data; and a control unit controlling the image capturing position change unit based on the movement amount determined by the movement amount determination unit.

14 Claims, 18 Drawing Sheets

(51) Int. Cl.
*H04N 5/225* (2006.01)
*H05G 2/00* (2006.01)

(52) U.S. Cl.
CPC .......... *H04N 5/2256* (2013.01); *H04N 5/232* (2013.01); *H04N 5/23212* (2013.01); *H04N 5/23299* (2018.08); *H05G 2/006* (2013.01); *H05G 2/008* (2013.01)

(56) References Cited

U.S. PATENT DOCUMENTS

| | | | |
|---|---|---|---|
| 2010/0294958 A1 | 11/2010 | Hayashi et al. | |
| 2012/0113313 A1* | 5/2012 | Egawa | G02B 7/36 348/345 |
| 2012/0228525 A1* | 9/2012 | Moriya | H05G 2/003 250/504 R |
| 2013/0256136 A1* | 10/2013 | Muraki | B03C 7/003 204/555 |
| 2014/0111635 A1 | 4/2014 | Suzuki et al. | |
| 2016/0234920 A1 | 8/2016 | Suzuki et al. | |
| 2018/0027642 A1* | 1/2018 | Ershov | H05G 2/006 250/504 R |

FOREIGN PATENT DOCUMENTS

| | | |
|---|---|---|
| WO | 2010/117861 A1 | 10/2010 |
| WO | 2015/041260 A1 | 3/2015 |

OTHER PUBLICATIONS

Notification of Transmittal of Translation of the International Preliminary Report on Patentability (Chapter I) and Translation of Written Opinion of the International Searching Authority; PCT/JP2016/055854; dated Aug. 28, 2018.

* cited by examiner

EXTREME ULTRAVIOLET LIGHT GENERATION DEVICE

CROSS-REFERENCE TO RELATED APPLICATIONS

The present application is a continuation application of International Application No. PCT/JP 2016/055854 filed on Feb. 26, 2016. The content of the application is incorporated herein by reference in its entirety.

BACKGROUND

1. Technical Field

The present disclosure relates to an extreme ultraviolet light generation device.

2. Related Art

In recent years, along with finer microfabrication in the semiconductor manufacturing process, finer transfer patterns in photolithography of the semiconductor manufacturing process have been developed rapidly. In the next generation, microfabrication of 70 to 45 nm and further of 32 nm or smaller will be required. Accordingly, for example, for the sake of satisfying the requirement of microfabrication of 32 nm or smaller, it is desirable to develop an exposure device including a combination of an extreme ultraviolet light generation device that generates extreme ultraviolet (EUV) light having a wavelength of about 13 nm and a reduced projection reflection optical system (reduced projection reflection optics).

As EUV light generation devices, three types of devices have been proposed, namely an LPP (Laser Produced Plasma) type device that uses plasma generated when a target material is irradiated with pulse laser light, a DPP (Discharge Produced Plasma) type device that uses plasma generated by discharging, and an SR (Synchrotron Radiation) type device that uses synchrotron radiation light.

CITATION LIST

Patent Literature

Patent Literature 1: International Publication No. 2010/117861
Patent Literature 2: U.S. Patent Application Laid-Open No. 2013/0256136
Patent Literature 3: U.S. Patent Application Laid-Open No. 2010/0294958

SUMMARY

An extreme ultraviolet light generation device according to one aspect of the present disclosure may include: a target supply unit, a laser device, an image capturing unit, an illumination unit, an image capturing position change unit, a movement amount determination unit and a control unit. The target supply unit may output a plurality of targets along a trajectory toward a plasma generation region. The laser device may emit laser light toward the plasma generation region. The image capturing unit may have an image capturing direction non-orthogonal and non-parallel to the trajectory, the image capturing unit may capture an image of a region including the plasma generation region, and the image capturing unit may output image data. The illumination unit may output illumination light to the region including the plasma generation region. The image capturing position change unit may change an image capturing position of the image capturing unit along the image capturing direction. The movement amount determination unit may determine a movement amount of the image capturing position, based on the image data. The control unit may control the image capturing position change unit, based on the movement amount determined by the movement amount determination unit.

BRIEF DESCRIPTION OF THE DRAWINGS

Some embodiments of the present disclosure will be described below as just examples with reference to the accompanying drawings.

EMBODIMENTS

<Contents>
1. Overall description of EUV light generation system
  1.1 Configuration
  1.2 Operation
2. EUV light generation device according to comparative example
  2.1 Configuration
    2.1.1 Target supply unit
    2.1.2 Target detection device
    2.1.3 Target image measurement device
  2.2 Operation
    2.2.1 Output of target
    2.2.2 Detection of target passing timing
    2.2.3 Target image measurement operation
3. Problem
4. First Embodiment
  4.1 Configuration
    4.1.1 Image capturing unit and illumination unit
    4.1.2 Movement amount determination unit
  4.2 Operation
  4.3 Effect
5. Second Embodiment
  5.1 Configuration and operation
    5.1.1 Image capturing unit and illumination unit
    5.1.2 Movement amount determination unit
  5.2 Effect
6. Third Embodiment
  6.1 Configuration
    6.1.1 Control system
    6.1.2 Image capturing unit and illumination unit
    6.1.3 Movement amount determination unit
  6.2 Operation
  6.3 Effect
7. Fourth Embodiment
  7.1 Configuration and operation
    7.1.1 Control system
    7.1.2 Image capturing unit and illumination unit
    7.1.3 Movement amount determination unit
8. Modification example
  8.1 Image capturing direction of image capturing unit
  8.2 Image capturing unit and illumination unit
  8.3 Change in image capturing position of image capturing unit
  8.4 Correlation search processing unit and Control unit Hereinafter, embodiments of the present disclosure will be described in detail with reference to the drawings. The embodiments described below illustrate some examples of the present disclosure, and do not limit the contents of the present disclosure. Further, all of the configurations and the operations described in the embodiments are not always indispensable as configurations and operations of the present disclosure. It should be noted that the same constituent elements are denoted by the same reference signs, and overlapping description is omitted.

1. Overall Description of EUV Light Generation System

1.1 Configuration

Figure 1:
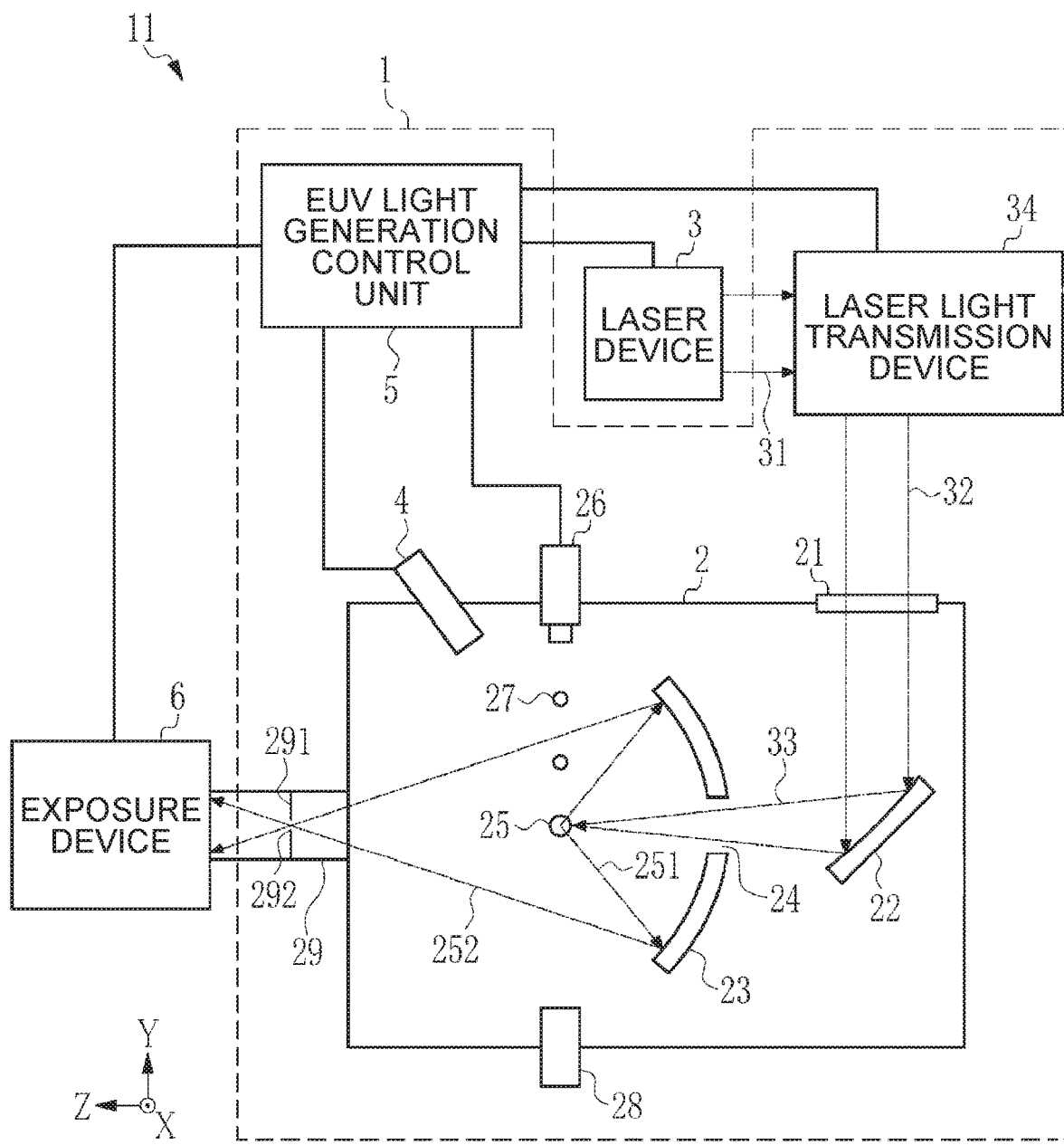
FIG. 1 is a diagram schematically illustrating a configuration of an exemplary LPP type EUV light generation system.

FIG. 1 schematically illustrates a configuration of an exemplary LPP type EUV light generation system. An EUV light generation device 1 may be used together with at least one laser device 3. In the present application, a system including an EUV light generation device 1 and a laser device 3 is called an EUV light generation system 11. As illustrated in FIG. 1, an EUV light output direction is assumed to be a Z-direction. A direction opposite to a target output direction is assumed to be a Y-direction. A direction perpendicular to both the Z-direction and the Y-direction is assumed to be an X-direction.

As illustrated in FIG. 1 and described below in detail, the EUV light generation device 1 includes a chamber 2 and a target supply unit 26. The chamber 2 is a sealable container. The target supply unit 26 supplies a target material to an inside of the chamber 2, and is mounted to penetrate a wall of the chamber 2, for example. The material of the target may include, but not be limited to, tin, terbium, gadolinium, lithium, xenon, or a combination of any two or more of them.

A wall of the chamber 2 has at least one through hole. The through hole is closed with the window 21. Pulse laser light 32 output from the laser device 3 penetrates the window 21. An EUV light condensing mirror 23 having, for example, a spheroidal reflection surface is arranged in the inside of the chamber 2. The EUV light condensing mirror 23 has a first focus and a second focus. On the surface of the EUV light condensing mirror 23, for example, a multilayer reflection film in which molybdenum and silicon are alternately layered is formed. The EUV light condensing mirror 23 may be disposed such that the first focus thereof is positioned in a plasma generation region 25 and the second focus thereof is positioned at an intermediate focal point (IF) 292, for example. A center portion of the EUV light condensing mirror 23 is provided with a through hole 24 through which pulse laser light 33 passes.

The EUV light generation device 1 includes an EUV light generation control unit 5, a target sensor 4, and the like. The target sensor 4 detects any one or more of the passing timing, position, shape, size, trajectory, and velocity of the target 27.

The EUV light generation device 1 includes a connecting section 29 that allows the inside of the chamber 2 and an inside of an exposure device 6 to communicate with each other. A wall 291 having an aperture 293 is provided at the inside of the connecting section 29. The wall 291 is disposed such that the aperture 293 is positioned at the second focus position of the EUV light condensing mirror 23.

Further, the EUV light generation device 1 includes a laser light transmission device 34, a laser light condensing mirror 22, a target recovery unit 28, and the like. The laser light transmission device 34 includes an optical element and an actuator. The optical element defines a transmission state of laser light. The actuator regulates a position, posture, and the like of the optical element. The target recovery unit 28 recovers residuals of the target 27 having not been made into plasma.

1.2 Operation

Referring to FIG. 1, the operation of an exemplary LPP type EUV light generation system is described. The pulse laser light 31 output from the laser device 3 passes through the laser light transmission device 34, and then penetrates the window 21 as the pulse laser light 32 and enters the chamber 2. The pulse laser light 32 travels inside the chamber 2 along at least one optical path of the laser light, is reflected by the laser light condensing mirror 22, and is radiated as the pulse laser light 33 to at least one target 27.

The target supply unit 26 outputs the target 27 formed of a target material toward the plasma generation region 25 in the chamber 2. The target 27 is irradiated with at least one pulse included in the pulse laser light 33. The target 27 irradiated with the pulse laser light is made into plasma, and radiation light 251 is radiated from the plasma. The EUV light condensing mirror 23 reflects EUV light included in the radiation light 251 with a higher reflectance in comparison with light in other wavelength regions. Reflected light 252 including the EUV light reflected by the EUV light condensing mirror 23 is condensed at the intermediate focal point 292 and output to the exposure device 6. One target 27 may be irradiated with a plurality of pulses included in the pulse laser light 33.

The EUV light generation control unit 5 presides over the control of the entire EUV light generation system 11. The EUV light generation control unit 5 processes a detection result of the target sensor 4. On the basis of the detection result of the target sensor 4, the EUV light generation control unit 5 may control the output timing of the target 27 and output direction and the like of the target 27, for example. Furthermore, the EUV light generation control unit 5 may control the oscillation timing of the laser device 3, the travel direction of the pulse laser light 32, and the condensing position of the pulse laser light 33, for example. The aforementioned various types of control are mere examples. Other types of control may be added as required.

Figure 2:
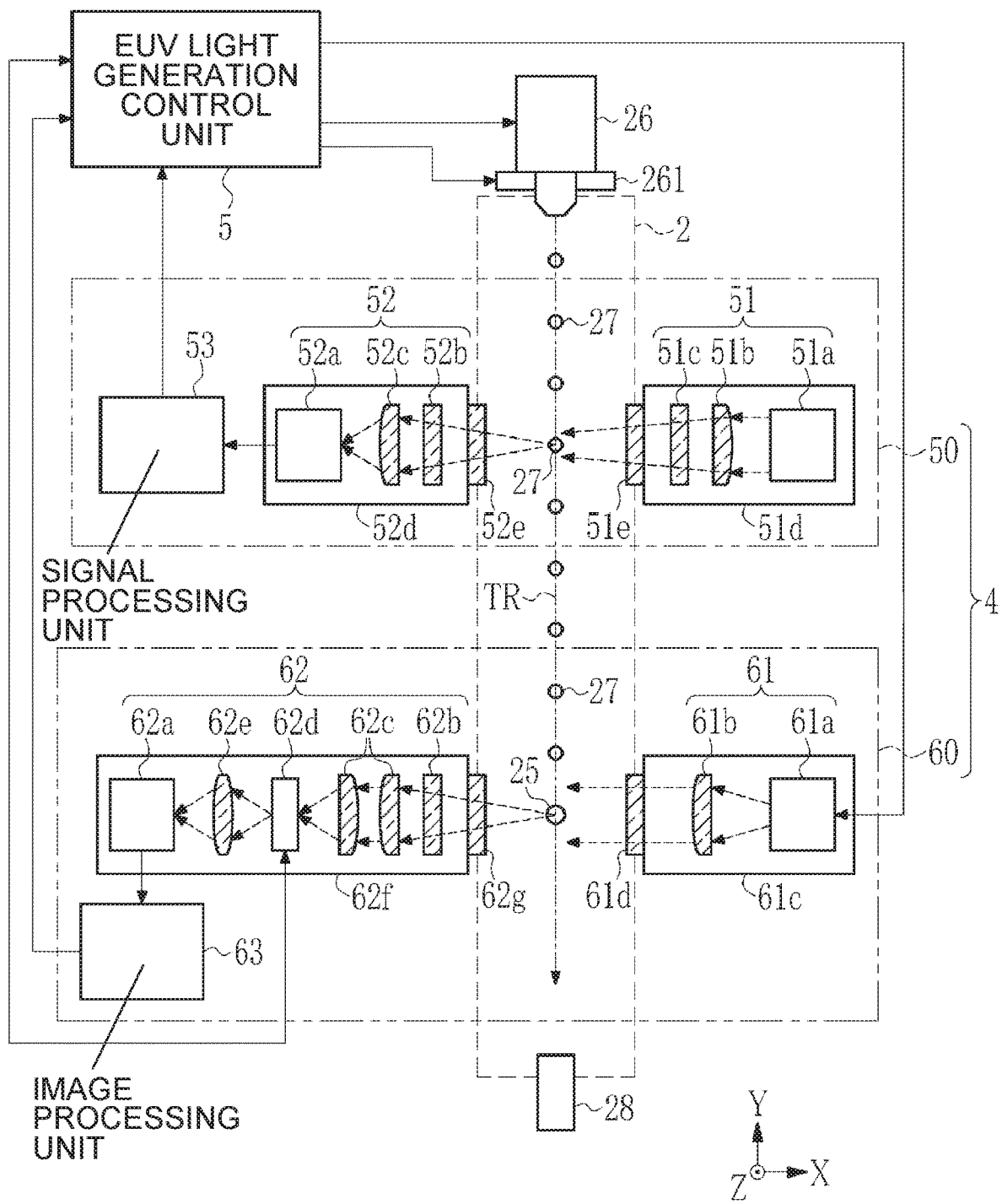
FIG. 2 is a diagram schematically illustrating a configuration of an LPP type EUV light generation system according to a comparative example of the present disclosure.

2. EUV Light Generation Device According to Comparative Example 2.1 Configuration FIG. 2 schematically illustrates a configuration of an LPP type EUV light generation system according to a comparative example of the present disclosure. In this comparative example, the configurations and operations of the target supply unit 26 and the target sensor 4, which are included in the EUV light generation device 1, are described in detail. The target sensor 4 includes a target detection device 50, and a target image measurement device 60.

2.1.1 Target Supply Unit

The target supply unit 26 is mounted onto the chamber 2 through a target supply unit actuator 261. The target supply unit actuator 261 is a two-axis stage that moves the position of the target supply unit 26 with respect to the chamber 2 in the Z-direction and the X-direction.

The target supply unit 26 internally stores the melted target material. The target material is pressurized with inert gas supplied into the target supply unit 26. The target supply unit 26 has an opening that is disposed in the chamber 2 and is not illustrated. A vibrator device, not illustrated, is disposed around the opening of the target supply unit 26.

2.1.2 Target Detection Device

The target detection device 50 includes an illumination unit 51, a measurement unit 52, and a signal processing unit 53. The illumination unit 51 and the measurement unit 52 are disposed substantially opposite to each other by interposing the trajectory TR of the target 27 between the target supply unit 26 and the plasma generation region 25. The illumination unit 51 and the measurement unit 52 are disposed so that their optical axes can be parallel to the X-direction, for example.

The illumination unit 51 includes a light source 51a, an illumination optical system 51b, and an optical filter 51c. The light source 51a is a laser light source that outputs CW (Continuous Wave) laser light as illumination light. The illumination optical system 51b shapes the illumination light so that a region including the trajectory TR of the target 27 being a measurement target of the measurement unit 52 can be irradiated with the illumination light output from the light source 51a. The optical filter 51c is, for example, a bandpass filter, and allows the illumination light output from the light source 51a to transmit therethrough but suppresses transmission of the EUV light radiated from the plasma generation region 25.

The illumination unit 51 is housed in a housing 51d. A window 51e for separating the chamber 2 at a low pressure and the illumination unit 51 at the atmospheric pressure from each other is provided in the housing 51d.

The measurement unit 52 includes an optical sensor 52a, an optical filter 52b, and a light receiving optical system 52c. The optical sensor 52a includes a single light receiving element, not illustrated, or light receiving elements, not illustrated, disposed one- or two-dimensionally. The optical sensor 52a includes a photodiode, photomultiplier tube, or multi-pixel photon counter, for example.

The optical filter 52b is, for example, a bandpass filter, and allows the illumination light output from the light source 51a to transmit therethrough but suppresses transmission of the EUV light radiated from the plasma generation region 25. The light receiving optical system 52c condenses the illumination light input from the light source 51a through the optical filter 52b, onto the optical sensor 52a. The optical sensor 52a outputs the change in intensity of light condensed by the light receiving optical system 52c, as change in output voltage.

The measurement unit 52 is housed in a housing 52d. A window 52e for separating the chamber 2 at a low pressure and the measurement unit 52 at the atmospheric pressure from each other is provided in the housing 52d.

The illumination light emitted from the illumination unit 51 passes through the region including the trajectory TR of the target 27 and is received by the optical sensor 52a. When one target 27 passes across the optical path of the illumination light, a part of the illumination light is blocked with the target 27, and the output voltage from the optical sensor 52a is changed.

A voltage signal output from the optical sensor 52a is input into the signal processing unit 53. When the voltage signal input from the optical sensor 52a is changed, the signal processing unit 53 generates a target passing timing signal that indicates that the target 27 has passed across the optical path of the illumination light.

2.1.3 Target Image Measurement Device

The target image measurement device 60 includes an illumination unit 61, an image capturing unit 62, and an image processing unit 63. The illumination unit 61 and the image capturing unit 62 are disposed substantially opposite to each other by interposing the plasma generation region 25. The illumination unit 61 and the image capturing unit 62 are disposed so that their optical axes can be parallel to the X-direction, for example.

The illumination unit 61 includes a light source 61a and an illumination optical system 61b. The light source 61a includes a pulse light source, such as a Xenon flash lamp or a pulse laser light source. The light source 61a outputs the pulse illumination light on the basis of a light emission trigger input from the EUV light generation control unit 5. The illumination optical system 61b shapes the illumination light so that a region including the plasma generation region 25 being to be captured by the image capturing unit 62 can be irradiated with the illumination light output from the light source 61a.

The illumination unit 61 is housed in a housing 61c. A window 61d for separating the chamber 2 at a low pressure and the illumination unit 61 at the atmospheric pressure from each other is provided in the housing 61c.

The image capturing unit 62 includes an image sensor 62a, an optical filter 62b, an imaging optical system 62c, an optical shutter 62d, and a transfer optical system 62e. The image sensor 62a includes light receiving elements which are two-dimensionally disposed but not illustrated, and is a CCD (Charge-coupled device) type image sensor, for example. The image capturing unit 62 captures an image of a region including the plasma generation region 25, and outputs image data.

The optical filter 62b includes, for example, a notch filter, and selectively suppresses the transmission of the illumination light emitted from the illumination unit 51 of the target detection device 50. The imaging optical system 62c forms an image of the target 27 with the illumination light emitted from the light source 61a, on the optical shutter 62d. The optical shutter 62d opens and closes the shutter on the basis of an optical shutter trigger input from the EUV light generation control unit 5. When the optical shutter 62d is in an open state, the transfer optical system 62e transfers the image of the target 27 formed on the optical shutter 62d, onto an image capturing plane of the image sensor 62a. The image sensor 62a photoelectrically converts the image of the target 27 transferred on the image capturing plane, generates image data that represents the image of the target 27, and outputs the data to the image processing unit 63.

The image capturing unit 62 is housed in a housing 62f. A window 62g for separating the chamber 2 at a low pressure and the image capturing unit 62 at the atmospheric pressure from each other is provided in the housing 62f.

The image data is input from the image sensor 62a into the image processing unit 63. The image processing unit 63 detects the image of the target 27 in the image data input from the image sensor 62a, and measures the state of the target 27 on the basis of the detected image. The state of the target 27 includes the position, shape, size, trajectory, velocity and the like of the target 27.

2.2 Operation

2.2.1 Output of Target

In the aforementioned target supply unit 26, the material of the target pressurized with the inert gas is output through the opening. By applying vibrations by the vibrator device to the target supply unit 26, the material of the target is separated into a plurality of droplets. The droplets move, as the target 27, from the target supply unit 26 to the plasma generation region 25 along the substantially linear trajectory TR. The pressure of the inert gas supplied into the target supply unit 26 is controlled by a control signal from the EUV light generation control unit 5. By controlling the pressure of the inert gas, the movement velocity of the target 27 is adjusted.

2.2.2 Detection of Target Passing Timing

The illumination unit 51 included in the target detection device 50 outputs the illumination light toward the trajectory TR of the target 27 and a region around the trajectory TR. When one target 27 passes across the optical path of the illumination light, the output voltage of the optical sensor 52a is changed. In response to the change in the output voltage of the optical sensor 52a, the signal processing unit 53 generates the target passing timing signal, and outputs the signal to the EUV light generation control unit 5.

The EUV light generation control unit 5 outputs the target passing timing signal to the laser device 3. The laser device 3 performs laser oscillation at a timing when a predetermined delay time elapses after receiving the target passing timing signal, and outputs the pulse laser light 31. The delay time is set so that the pulse laser light 33 is condensed at the plasma generation region 25 at a timing when the target 27 reaches the plasma generation region 25.

2.2.3 Target Image Measurement Operation

The illumination unit 61 included in the target image measurement device 60 outputs pulse illumination light toward the plasma generation region 25 and a region around the plasma generation region 25. The output of the illumination light by the illumination unit 61 is controlled by the EUV light generation control unit 5 so as to be output with a predetermined delay time with respect to the target passing timing signal output from the target detection device 50. When at least one target 27 is present on the optical path of the illumination light output from the illumination unit 61, the target 27 is irradiated with the illumination light. The optical shutter 62d is controlled by the EUV light generation control unit 5 such that the optical shutter 62d is transited from the closed state to the open state in synchronization with the light emission from the illumination unit 61.

At this time, the image of the target 27 is transferred onto the image capturing plane of the image sensor 62a included in the image capturing unit 62. The image sensor 62a is controlled by the EUV light generation control unit 5 so as to start exposure in synchronization with the transition of the optical shutter 62d from the closed state to the open state. After completion of the exposure, the image sensor 62a outputs image data that represents the image of the target 27 to the image processing unit 63. The image processing unit 63 detects the image of the target 27 in the image data, and measures the state of the target 27 on the basis of the detected image. The image processing unit 63 transmits data indicating the state of the target 27 to the EUV light generation control unit 5.

The EUV light generation control unit 5 controls the laser device 3, the target supply unit 26 and the like on the basis of data which is on the position, shape, size, trajectory, velocity and the like of the target 27 and is included in the data indicating the state of the target 27. For example, in a case where the laser device 3 outputs pre-pulse laser light and main pulse laser light, the delay time of the main pulse laser light from the pre-pulse laser light is adjusted. The droplet-shaped target 27 is irradiated with the pre-pulse laser light, and the target 27 is diffused. The diffused target 27 is irradiated with the main pulse laser light to generate plasma.

In this case, the target image measurement device 60 may capture an image of a diffused target which is an example of the target 27. The EUV light generation control unit 5 may control the delay times of the pre-pulse laser light and the main pulse laser light, and the actuators of the target supply unit 26 and the laser light transmission device 34, on the basis of the state of the target 27 measured by the target image measurement device 60. Further, the EUV light generation control unit 5 may control the pressure of the inert gas supplied into the target supply unit 26 so that the movement velocity of the target 27 approaches a target value, on the basis of data on the movement velocity of the target.

Figure 3:
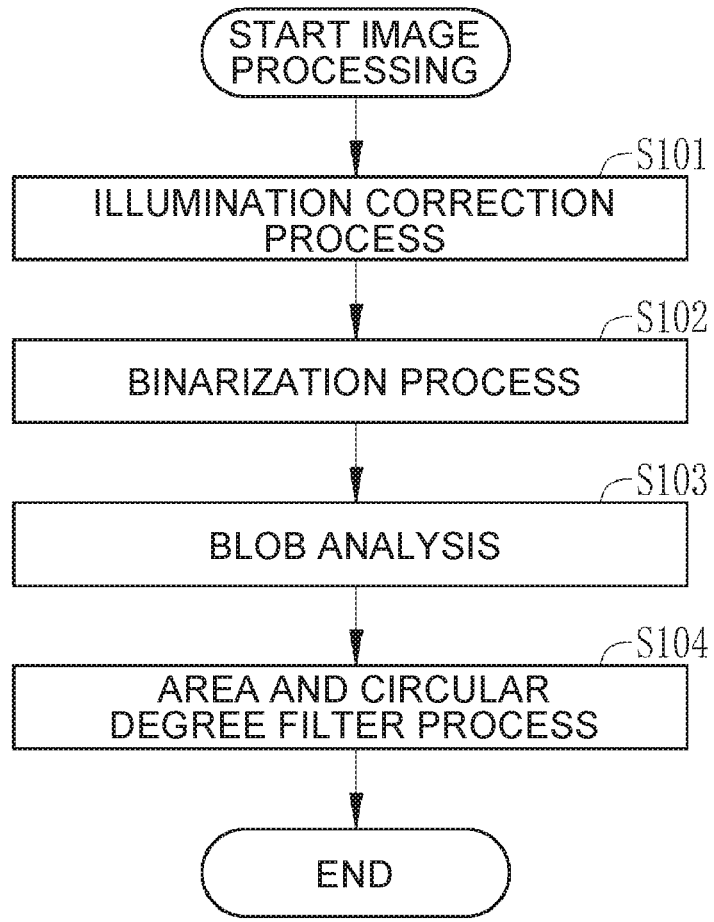
FIG. 3 is a flowchart illustrating image processing by an image processing unit 63.

FIG. 3 is a flowchart illustrating image processing by the image processing unit 63. According to the following processes, the image processing unit 63 detects the image of the target 27 in the image data, and measures the state of the target 27.

First, in S101, the image processing unit 63 applies an illumination correction process to the image data input from the image capturing unit 62. More specifically, the image processing unit 63 obtains the average value of pixel values from the entire image data, and subtracts the average value from each pixel value. Next, in S102, the image processing unit 63 performs a binarization process. More specifically, the image processing unit 63 compares each pixel value of the image data after the illumination correction process with a predetermined threshold, and extracts pixels having a larger pixel value than the threshold.

Next, in S103, the image processing unit 63 performs blob analysis. More specifically, the image processing unit 63 extracts blobs that are regions where pixels extracted by the binarization process are aggregated, and calculates the area and shape of each blob. Next, in S104, the image processing unit 63 performs an area and circular degree filter process. More specifically, the image processing unit 63 applies the predetermined area and circular degree filter to each blob extracted by the blob analysis, thereby extracting blobs that have an area of a certain value or higher and a circular degree of a certain value or higher, as images of the target 27.

The position, shape, size, trajectory, velocity and the like of the target 27, which represent the state of the target 27, are obtained on the basis of the result and the like of the blob analysis in S103.

3. Problem

Figure 4:
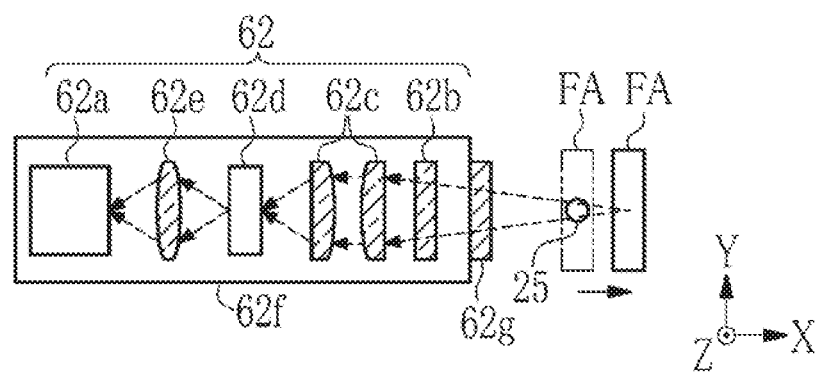
FIG. 4 is a diagram illustrating a subject of the present disclosure.

FIG. 4 is a diagram illustrating a subject of the present disclosure. In the aforementioned comparative example, it is preferable that the image capturing unit 62 included in the target image measurement device 60 has the imaging optical system 62c with a large numerical aperture (NA) in order to obtain a high spatial resolution. However, if the numerical aperture is increased, the depth of field of the image capturing unit 62 is reduced. The depth of field is the width of a focus area FA in the image capturing direction; the focus area FA is an area where the focus of the image capturing unit 62 is achieved.

Further, the image capturing position of the image capturing unit 62 can vary in the image capturing direction owing to various factors. The image capturing position is the center position of the focus area FA in the image capturing direction. An imaging subject that is present in the focus area FA is focused on the image capturing plane of the image sensor 62a. The variation in image capturing position can be caused by variations in the refractive indices of optical elements, such as the window 62g and the imaging optical system 62c, owing to heat application by scattering light of the EUV light and the pulse laser light 33, for example. FIG. 4 illustrates an example in which the image capturing position varies, and "focused state" where the plasma generation region 25 is included in the focus area FA is changed to "non-focused state" where the plasma generation region 25 is not included in the focus area FA. As described above, it is preferable that the depth of field of the image capturing unit 62 be small. Consequently, even if the image capturing position slightly varies from the focused state, the state can be the non-focused state.

In the focused state, the image of the target 27 has high contrast and sharpness. Consequently, the measurement accuracy of the state of the target 27 is high. On the other hand, in the non-focused state, the image of the target 27 has low contrast and sharpness. Consequently, the measurement accuracy of the state of the target 27 deteriorates. If the measurement accuracy of the state of the target 27 is deteriorated, the control of the laser device 3, the target supply unit 26 and the like becomes unstable, and the generation of the EUV light becomes unstable.

In the embodiments described below, to solve the problem, the image capturing position of the image capturing unit 62 can be changed, the image capturing direction is non-orthogonal to the trajectory TR of the target, and the image capturing position is changed on the basis of the image data where a plurality of targets 27 are captured, thereby improving the sharpness of the image of the target 27 and stabilizing the EUV light generation.

4. First Embodiment

Next, an EUV light generation system that includes an EUV light generation device according to a first embodiment of the present disclosure is described. In the description below, elements substantially identical to the constituent elements of the EUV light generation system that includes the EUV light generation device of the aforementioned comparative example are assigned the identical signs, and the description thereof is appropriately omitted.

4.1 Configuration

Figure 5:
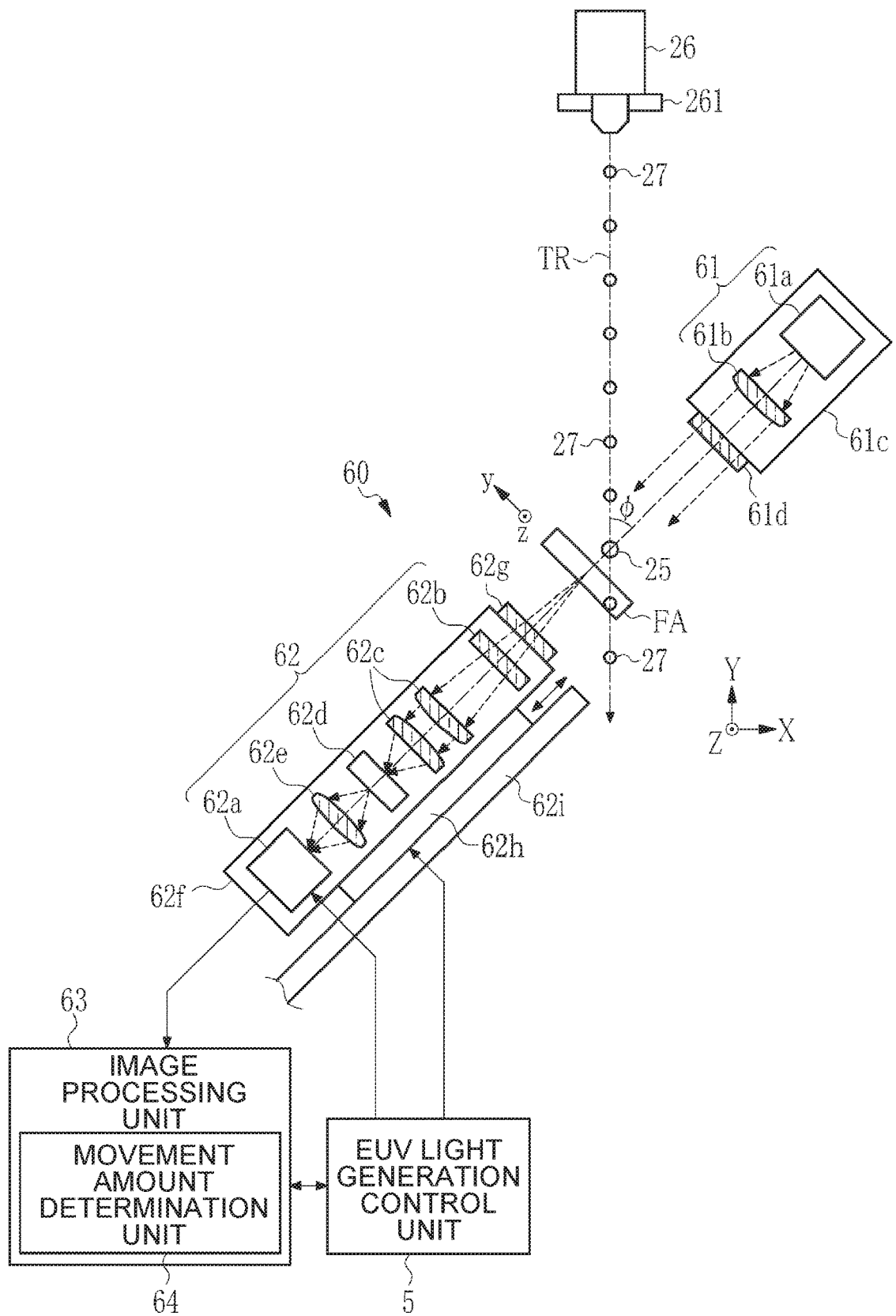
FIG. 5 is a diagram illustrating a target image measurement device 60, a target supply unit 26, and an EUV light generation control unit 5 which are included in an EUV light generation device according to a first embodiment of the present disclosure.

FIG. 5 is a diagram illustrating a target image measurement device 60, a target supply unit 26, and an EUV light generation control unit 5 which are included in an EUV light generation device according to the first embodiment of the present disclosure. An image capturing unit 62 included in the target image measurement device 60 according to the first embodiment further includes a sensor stage 62h and a stage support 62i. Further, an image processing unit 63 in the first embodiment further includes a movement amount determination unit 64. The other configuration points are analogous to the configuration points of the comparative example. The EUV light generation control unit 5 corresponds to a control unit in the present disclosure.

4.1.1 Image Capturing Unit and Illumination Unit

The image capturing unit 62 is disposed so as to have an image capturing direction that is non-orthogonal and non-parallel to the trajectory TR of the target 27. Further, the image capturing direction of the image capturing unit 62 is parallel to the XY plane. That is, the angle φ between the image capturing direction of the image capturing unit 62 and the Y-direction indicating the direction of the trajectory TR of the target 27 is in an angle range of 0<φ<90° or 90°<φ<180°. In the first embodiment, φ=45°. The illumination unit 61 is disposed so as to face the image capturing unit 62. That is, the illumination direction of the illumination unit 61 and the image capturing direction of the image capturing unit 62 are opposite and parallel to each other.

In this way, the image capturing direction of the image capturing unit 62 is non-orthogonal and non-parallel to the trajectory TR of the target 27. Consequently, in the image data output from the image capturing unit 62, a plurality of images of targets 27 having different distances to the image capturing position are simultaneously captured.

The sensor stage 62h holds the housing 62f of the image capturing unit 62. The stage support 62i supports the sensor stage 62h movably along the image capturing direction of the image capturing unit 62. Further, the stage support 62i is fixed to the chamber 2. The sensor stage 62h is a linear actuator, which is driven by a voice coil motor or the like, and moves the housing 62f along the image capturing direction of the image capturing unit 62 on the basis of the control of the EUV light generation control unit 5. The sensor stage 62h corresponds to an image capturing position change unit in the present disclosure.

FIG. 5 illustrates a case where the focus area FA of the image capturing unit 62 is at a position deviating from the plasma generation region 25, and the image capturing unit 62 is in a non-focused state with respect to the plasma generation region 25. The movement amount determination unit 64 described later determines the movement amount of the sensor stage 62h which is required to cause the image capturing unit 62 to be in the focused state with respect to the plasma generation region 25.

4.1.2 Movement Amount Determination Unit

Figure 6:
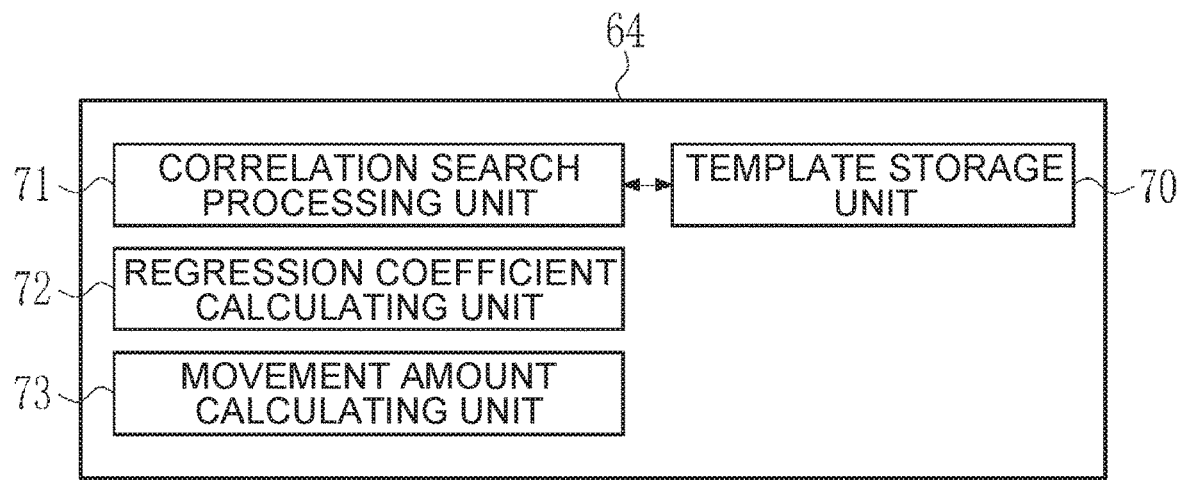
FIG. 6 is a diagram illustrating a configuration of a movement amount determination unit 64.

FIG. 6 is a diagram illustrating the configuration of the movement amount determination unit 64. The movement amount determination unit 64 includes a template storage unit 70, a correlation search processing unit 71, a regression coefficient calculating unit 72, and a movement amount calculating unit 73.

The template storage unit 70 stores a focused image that is an image of the target 27 captured when the image capturing unit 62 is in the focused state with respect to the plasma generation region 25. The focused image is preliminarily stored in the template storage unit 70. The correlation search processing unit 71 performs a normalized correlation search process by using the focused image stored in the template storage unit 70 as the template.

The normalized correlation search process by the correlation search processing unit 71 is performed on the basis of the following expression (1), for example.

$$\gamma(y_s, z_x) = \frac{\int\int((I(y_s z) - I_{av})(T(y - y_s, z - z_s) - T_{av}))dydz}{\sqrt{\int\int(I(y, z) - I_{av})^2 dydz} \sqrt{\int\int(T(y - y_s, z - z_s) - T_{av})^2 dydz}} \quad (1)$$

Here, I(y, z) indicates the image data output from the image capturing unit 62. The y and z indicate the coordinates on the image capturing plane of the image capturing unit 62 as illustrated in FIG. 5. T(y, z) indicates template data. $I_{av}$ indicates the average value of image data I(y, z). $T_{av}$ indicates the average value of template data T(y, z). Further, the $y_s$ and $z_s$ indicate the center position of the template data T(y, z). $\gamma(y_s, z_s)$ indicates the normalized correlation value representing the similarity with the focused image. Hereinafter, $\gamma(y_s, z_s)$ is simply represented as $\gamma(y, z)$.

In actuality, the correlation search processing unit 71 calculates the normalized correlation value $\gamma(y, z)$ on the basis of the discrete algorithm based on the aforementioned expression (1) while changing the center position of the template data T(y, z) over the entire range in the image data I(y, z). In the image data I(y, z), the higher the similarity at the position with the focused image is, the closer to "1" the normalized correlation value $\gamma(y, z)$ is, the lower the similarity at the position with the focused image is, the closer to "0" the value is.

Figure 7:
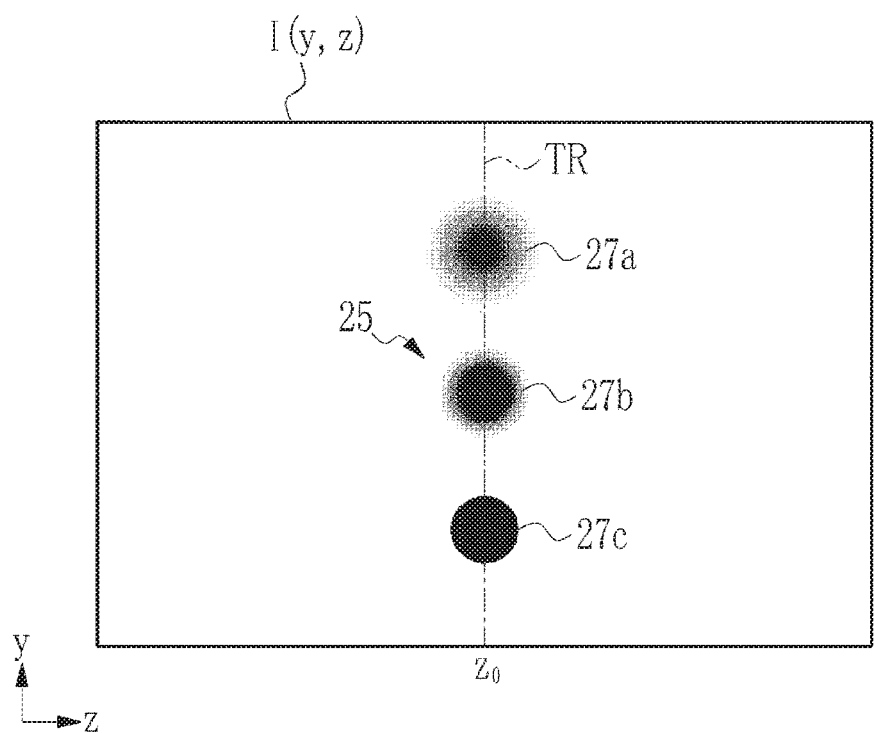
FIG. 7 is a diagram illustrating an example of image data I (y, z) output from an image capturing unit 62 at an image capturing position illustrated in FIG. 5.

FIG. 7 is a diagram illustrating an example of the image data I (y, z) output from the image capturing unit 62 at the image capturing position illustrated in FIG. 5. In the image data I(y, z), three targets 27a, 27b and 27c consecutive along the trajectory TR are captured. In this example, the image of the target 27c positioned downstream of the plasma generation region 25 on the trajectory TR is captured in a state with the highest focusing degree. The targets 27a, 27b positioned in the plasma generation region 25 are in the non-focused state. The number of targets 27 captured in the image data I(y, z) is not limited to "3", and is only required to be two or more.

Figure 8:
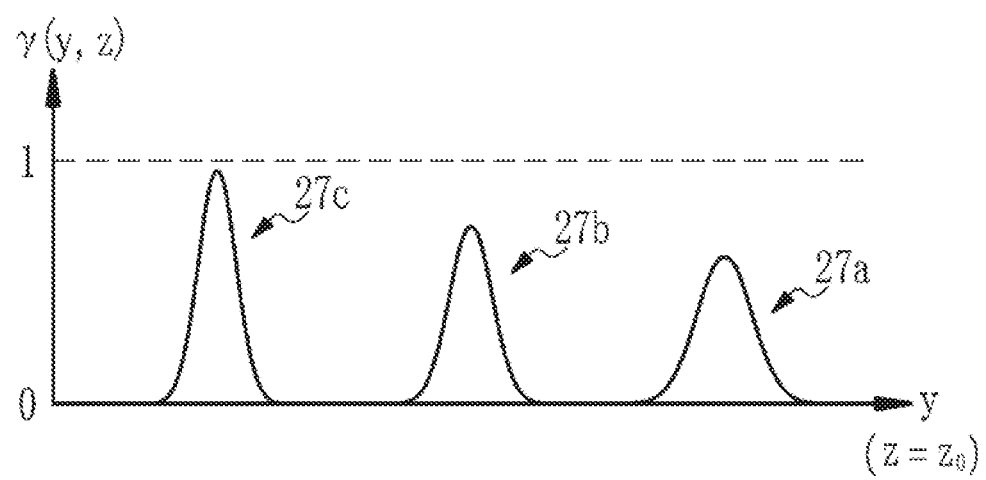
FIG. 8 is a diagram illustrating an example of normalized correlation values γ(y, z) along a line corresponding to a trajectory TR of a target 27.

FIG. 8 is a diagram illustrating an example of normalized correlation values $\gamma(y, z)$ along a line ($z=z_0$) corresponding to the trajectory TR of the targets 27. In this way, the higher the focusing degree of the three targets 27a, 27b and 27c is, the larger the peak value of the normalized correlation value $\gamma(y, z)$ thereof becomes. In this example, the normalized correlation value $\gamma(y, z)$ corresponding to the target 27c has the highest peak value.

Figure 9:
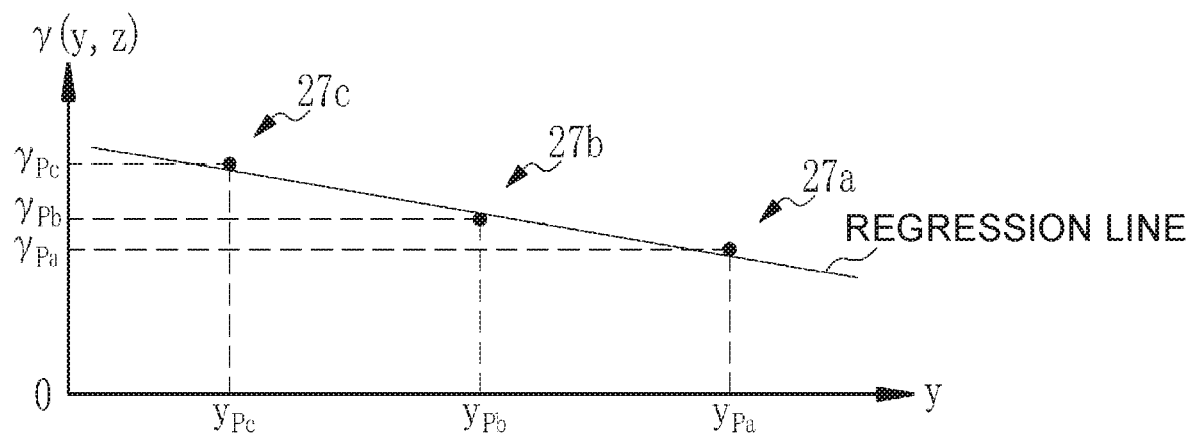
FIG. 9 is a diagram illustrating an example between peak values of the normalized correlation values γ(y, z) and respective peak positions with respect to a y-direction.

Further, the correlation search processing unit 71 calculates the peak value of the normalized correlation value $\gamma(y, z)$ and the peak position that correspond to each target 27 captured in the image data I(y, z), on the basis of the normalized correlation value $\gamma(y, z)$. FIG. 9 illustrates the peak values $\gamma_{Pa}$, $\gamma_{Pb}$ and $\gamma_{Pc}$ of the normalized correlation values $\gamma(y, z)$, and the peak positions $y_{Pa}$, $y_{Pb}$ and $y_{Pc}$ with respect to the y-direction.

The regression coefficient calculating unit 72 calculates the regression coefficient on the basis of the peak values and the peak positions calculated by the correlation search processing unit 71. The regression coefficient represents the slope of the regression line illustrated in FIG. 9. More specifically, the regression coefficient calculating unit 72 calculates the regression coefficient θ on the basis of the following expression (2).

$$\theta = \frac{\sum_i (y_{Pi} - y_{av})(\gamma_{Pi} - \gamma_{av})}{\sum_i (y_{Pi} - y_{av})^2} \quad (2)$$

Here, $\gamma_{av}$ is the average value of the peak values $\gamma_{Pi}$ of the normalized correlation values $\gamma(y, z)$. $y_{av}$ is the average value of the peak positions $y_{Pi}$ of the normalized correlation values $\gamma(y, z)$.

In the example of FIG. 9, the regression coefficient θ is negative. The negative value of the regression coefficient θ indicates that the image capturing unit 62 is in focus on the downstream side of the trajectory TR, i.e., that the image capturing position of the image capturing unit 62 deviates from the plasma generation region 25 toward the image capturing unit 62. On the contrary, the positive value of the regression coefficient θ indicates that the image capturing position of the image capturing unit 62 deviates from the plasma generation region 25 toward the side opposite to the image capturing unit 62.

The movement amount calculating unit 73 calculates the movement amount of the sensor stage 62h required to cause the image capturing position of the image capturing unit 62 to coincide substantially with the plasma generation region 25, on the basis of the regression coefficient θ calculated by the regression coefficient calculating unit 72. The movement amount includes the movement direction, and the movement distance. The movement distance is a scalar quantity.

More specifically, the movement amount calculating unit 73 determines whether the regression coefficient θ is positive or negative. If the regression coefficient θ is negative, the movement direction of the sensor stage 62h is defined as "positive direction". If the regression coefficient θ is positive, the movement direction of the sensor stage 62h is defined as "negative direction". The positive direction is a direction that makes the image capturing unit 62 be closed to the plasma generation region 25. The negative direction is a direction that makes the image capturing unit 62 be away from the plasma generation region 25.

Further, the movement amount calculating unit 73 preliminarily stores the relationship between the deviation of the image capturing position of the image capturing unit 62 from the plasma generation region 25 and the absolute value of the regression coefficient θ, and calculates the movement distance of the sensor stage 62h on the basis of the absolute value of the regression coefficient θ.

4.2 Operation

The EUV light generation device 1 performs a burst operation that alternately repeats a burst period during which the EUV light is repeatedly output and a rest period during which the EUV light is not output, according to a trigger signal input from the exposure device 6. The burst period is a period during which the exposure device 6 performs exposure in one exposure area on a semiconductor wafer. The rest period is a period after completion of exposure in one exposure area until start of exposure in another exposure area. In the rest period, a wafer stage which is not illustrated is moved.

In the burst period, both a laser oscillation operation by the laser device 3 and a target generating operation by the target supply unit 26 are performed. In the rest period, the laser oscillation operation is stopped while the target generating operation is maintained. The target image measurement operation by the target image measurement device 60 is performed in the rest period, for example. The target image measurement operation may be performed in a period during which the target generating operation is performed and the laser oscillation operation is stopped, and may be performed in a period other than the rest period of the burst operation.

Figure 14:
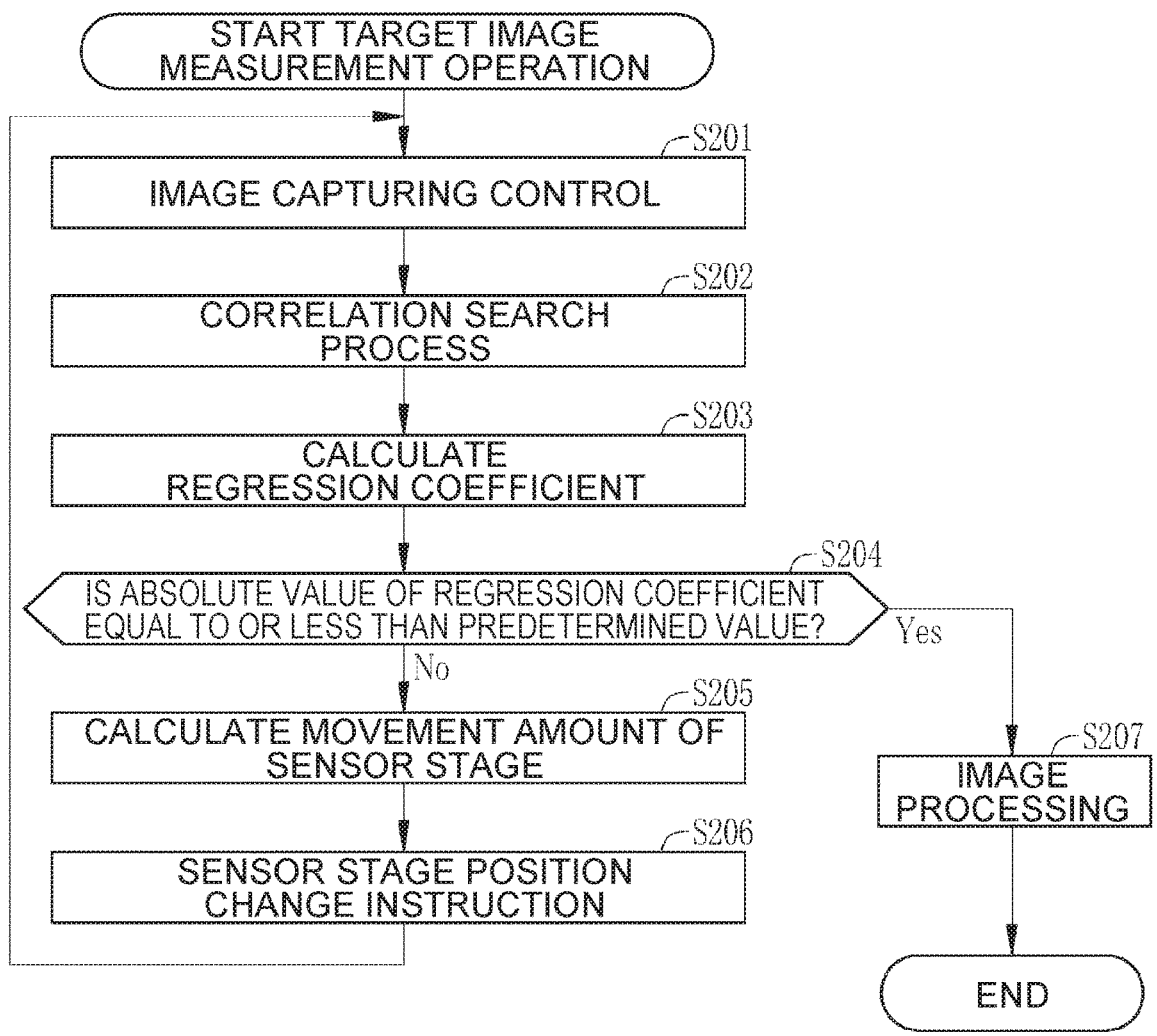
FIG. 14 is a flowchart illustrating a target image measurement operation for an EUV light generation device according to the first embodiment.

FIG. 14 is a flowchart illustrating the target image measurement operation for the EUV light generation device according to the first embodiment. The EUV light generation device performs the target image measurement operation according to the following process. In S201, pulse illumination light is output by the illumination unit 61, and the images of the targets 27 irradiated with the illumination light are captured by the image capturing unit 62. Image data generated by the image capturing is input into the movement amount determination unit 64.

Next, in S202, the normalized correlation search process is performed by the correlation search processing unit 71 by using the focused image of the target 27 preliminarily stored in the template storage unit 70 as a template. Further, the peak value of the normalized correlation values γ(y, z) and the peak position that correspond to each target 27 captured by the image capturing unit 62 are calculated by the correlation search processing unit 71.

Next, in S203, the regression coefficient θ is calculated by the regression coefficient calculating unit 72. In S204, it is determined, by the EUV light generation control unit 5, whether the absolute value of the regression coefficient θ calculated by the regression coefficient calculating unit 72 is equal to or less than a predetermined value or not. If it is determined that the absolute value of the regression coefficient θ is larger than the predetermined value (S204; No), the processing transitions to S205. In S205, the movement amount of the sensor stage 62h is calculated by the movement amount calculating unit 73 on the basis of the regression coefficient θ.

Next, in S206, the EUV light generation control unit 5 outputs a position change instruction to the sensor stage 62h on the basis of the movement amount determined by the movement amount determination unit 64, and moves the sensor stage 62h. For example, as illustrated in FIG. 9, if the regression coefficient θ is negative, the sensor stage 62h is moved in the positive direction by a distance according to the absolute value of the regression coefficient θ.

Figure 10:
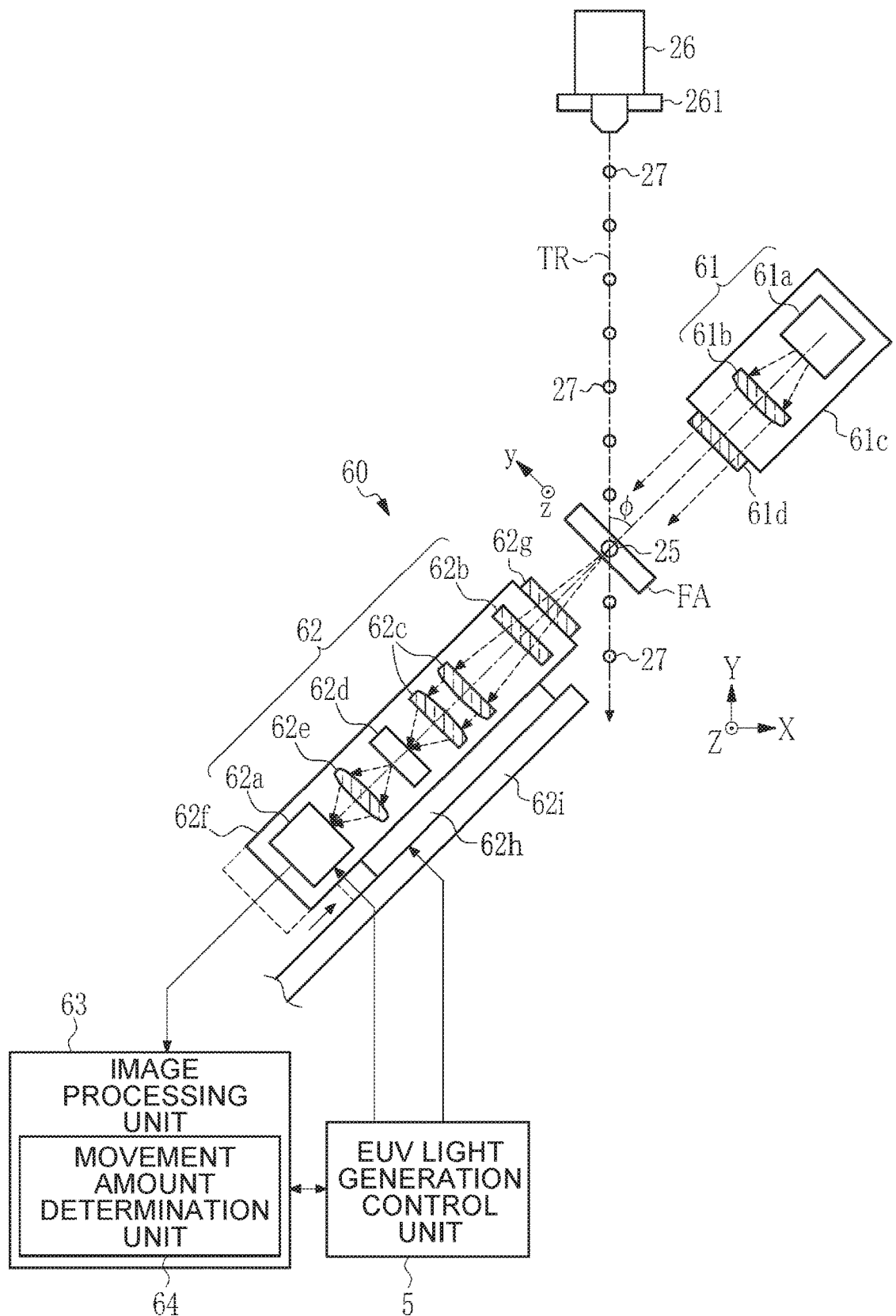
FIG. 10 is a diagram illustrating an example where a focused state is achieved by movement of a sensor stage 62h.
Figure 11:
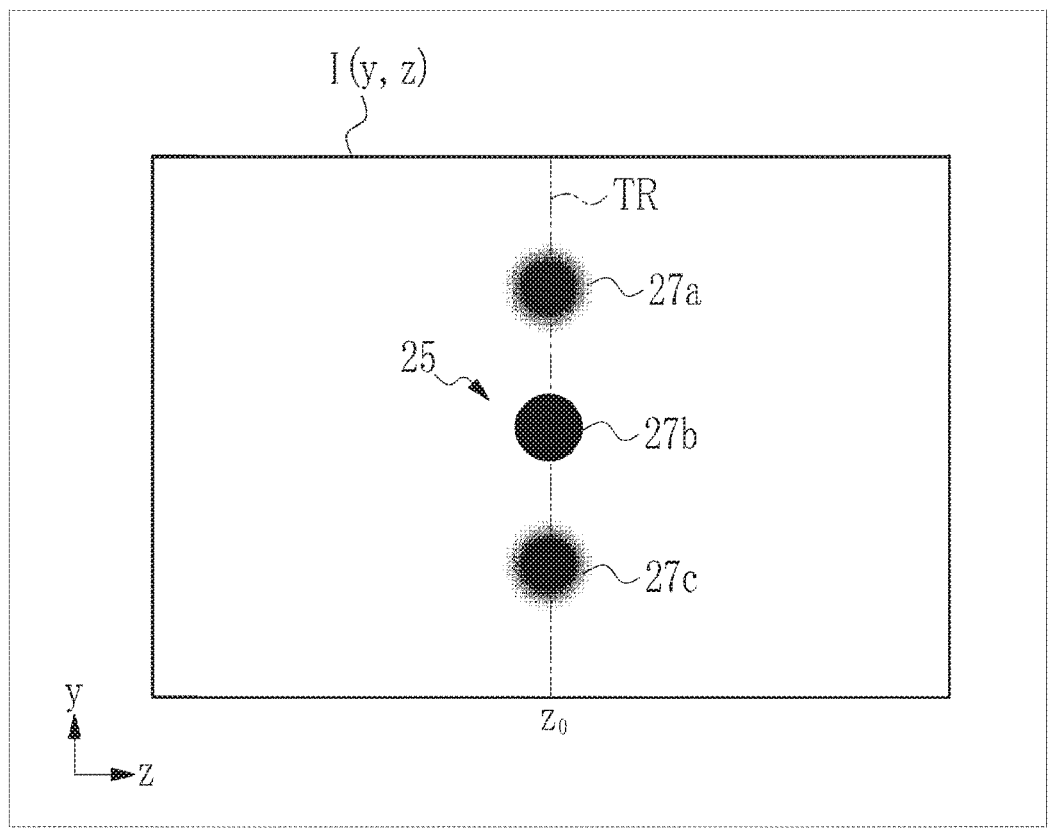
FIG. 11 is a diagram illustrating an example of image data output from the image capturing unit 62 in a focused state.
Figure 12:
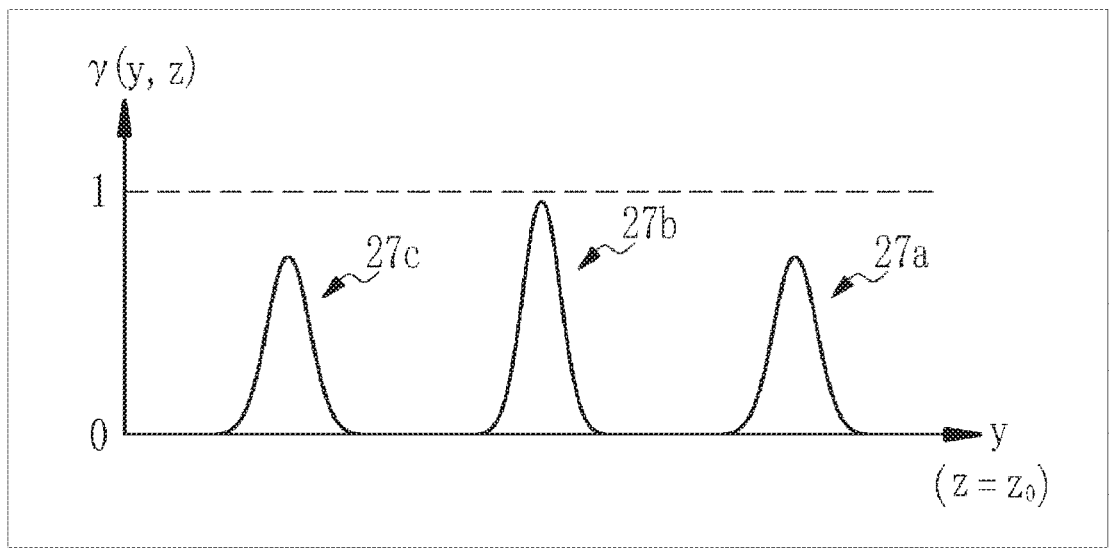
FIG. 12 is a diagram illustrating an example of the normalized correlation values γ(y, z) in the focused state.
Figure 13:
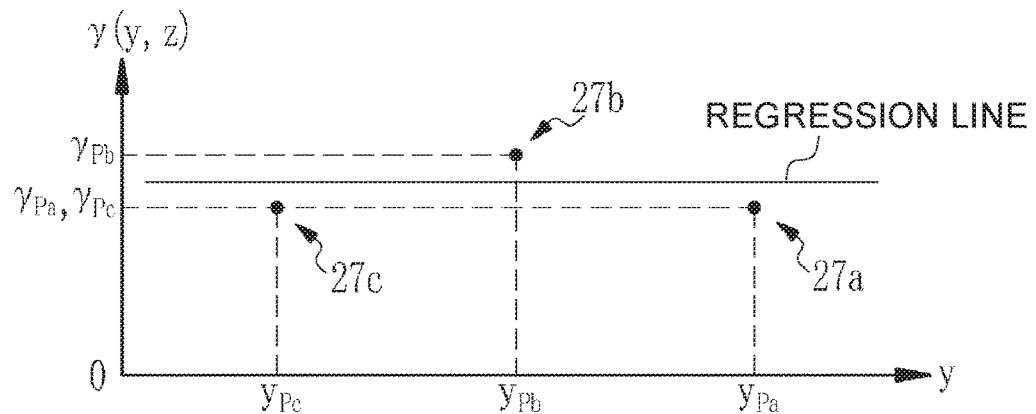
FIG. 13 is a diagram illustrating a regression line in the focused state.

FIG. 10 is a diagram illustrating an example where the sensor stage 62h is moved and the image capturing position of the image capturing unit 62 substantially coincides with the plasma generation region 25 accordingly to achieve the focused state. FIG. 11 is a diagram illustrating the example of image data output from the image capturing unit 62 in the focused state. In this way, the contrast of the image of the target 27b positioned in the plasma generation region 25 is improved, and the sharpness is improved. FIG. 12 is a diagram illustrating an example of normalized correlation values γ(y, z) in the focused state. As illustrated in FIG. 13, the slope of the regression line, i.e., the value of the regression coefficient θ is substantially "0".

After S206, the processing returns to S201, and the operation of the aforementioned S201 to S204 is performed. In S204, if it is determined that the absolute value of the regression coefficient θ is equal to or less than the predetermined value (S204; Yes), the processing transitions to S207. In S207, instead of the image processing described in the aforementioned comparative example, grayscale blob analysis is performed. More specifically, the image processing unit 63 adopts, as the target, the image of the target 27 having the highest peak value of the normalized correlation values γ(y, z) in the image data I(y, z) obtained in S201, and performs the grayscale blob analysis. The grayscale blob analysis is performed without performing the binarization process. The position, shape, size, trajectory, velocity and the like of the target 27, which represent the state of the target 27, are obtained on the basis of the result of the grayscale blob analysis.

4.3 Effect

According to the first embodiment, the image capturing position of the image capturing unit 62 is changed on the basis of the image data obtained by capturing in the direction inclined from the trajectory TR of the target 27. Consequently, the image of the target 27 can be sharply captured, and the EUV light generation can be stabilized.

5. Second Embodiment

Next, an EUV light generation system that includes an EUV light generation device according to a second embodiment of the present disclosure is described. In the description below, elements substantially identical to the constituent elements of the EUV light generation system that includes the EUV light generation device of the aforementioned comparative example or the first embodiment are assigned the identical signs, and the description thereof is appropriately omitted.

In the first embodiment, by disposing the illumination unit 61 opposite to the image capturing unit 62, the illumination light output from the illumination unit 61 is caused to enter the image capturing unit 62 via the trajectory TR of the target 27. That is, in the first embodiment, a shadow generated by blocking the illumination light with the target 27 is captured as a target image. On the other hand, in the second embodiment, by not disposing the illumination unit 61 opposite to the image capturing unit 62, the trajectory TR of the target 27 is irradiated with the illumination light output from the illumination unit 61. That is, in the second embodiment, the reflected light of the illumination light by the target 27 is captured as a target image.

Figure 15:
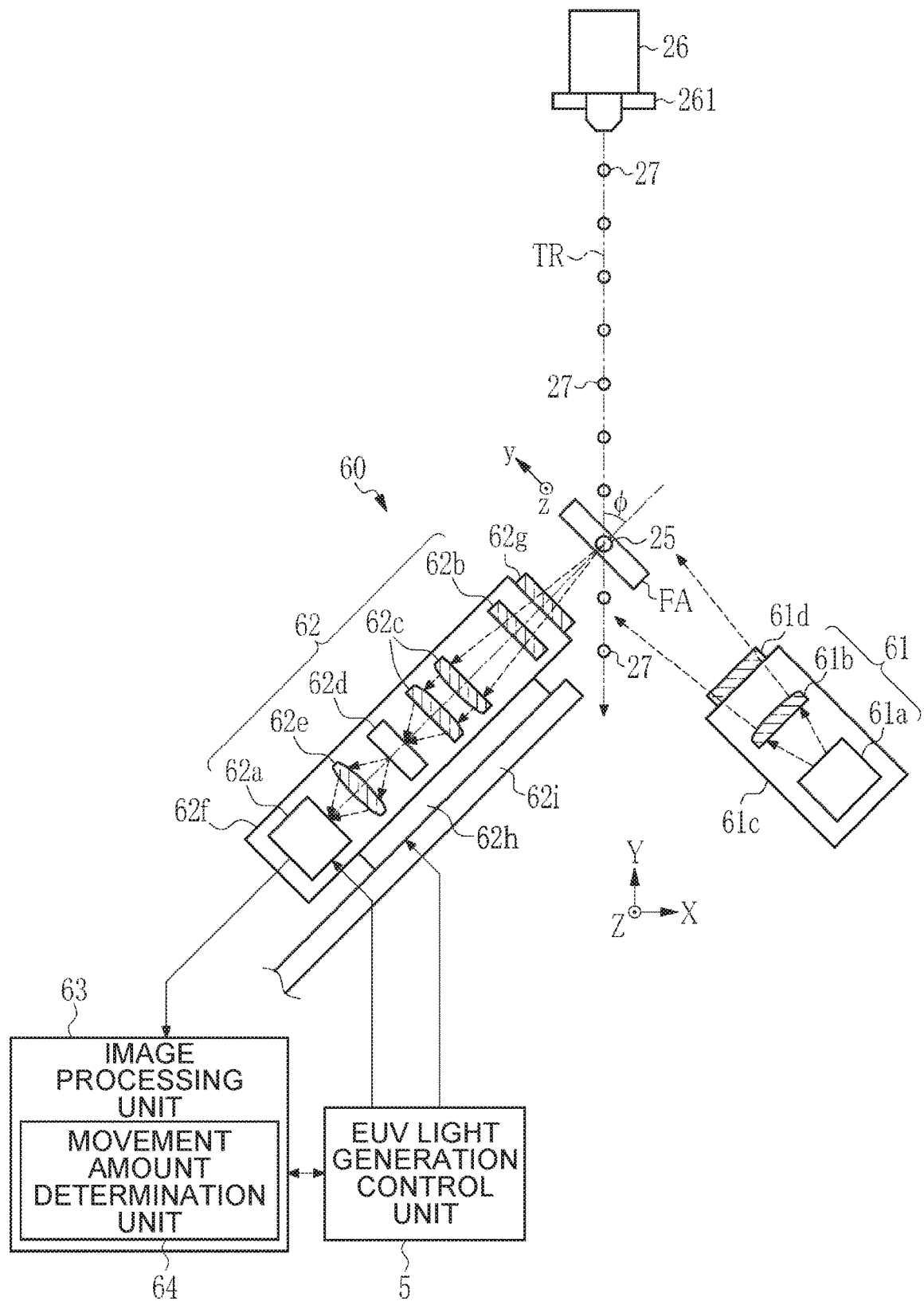
FIG. 15 is a diagram illustrating a target image measurement device 60, a target supply unit 26, and an EUV light generation control unit 5 which are included in an EUV light generation device according to a second embodiment of the present disclosure.

FIG. 15 is a diagram illustrating a target image measurement device 60, a target supply unit 26, and an EUV light generation control unit 5 which are included in an EUV light generation device according to the second embodiment of the present disclosure. The target image measurement device 60 according to the second embodiment is what is called a flow sensor that mainly measures the trajectory TR of the target 27.

5.1 Configuration and Operation
5.1.1 Image Capturing Unit and Illumination Unit As with the first embodiment, the image capturing unit 62 is disposed so as to have an image capturing direction that is non-orthogonal and non-parallel to the trajectory TR of the target 27. The angle φ between the image capturing direction of the image capturing unit 62 and the Y-direction is in an angle range of 0<φ<90° or 90°<φ<180°. In the second embodiment, it is configured such that φ=45°.

The illumination unit 61 is disposed so as not to face the image capturing unit 62. In the second embodiment, the illumination unit 61 is disposed to have an illumination direction orthogonal to the image capturing direction of the image capturing unit 62. A region that includes the plasma generation region 25 and the focus area FA is irradiated with the emitted light output from the illumination unit 61.

In the second embodiment, the light source 61a included in the illumination unit 61 does not output the pulse illumination light but outputs CW light as the illumination light. The image sensor 62a included in the image capturing unit 62 receives light reflected by the target 27. The EUV light generation control unit 5 controls the optical shutter 62d and the image sensor 62a to adjust the exposure time so that the image of the target 27 can be linearly captured.

5.1.2 Movement Amount Determination Unit

Figure 16:
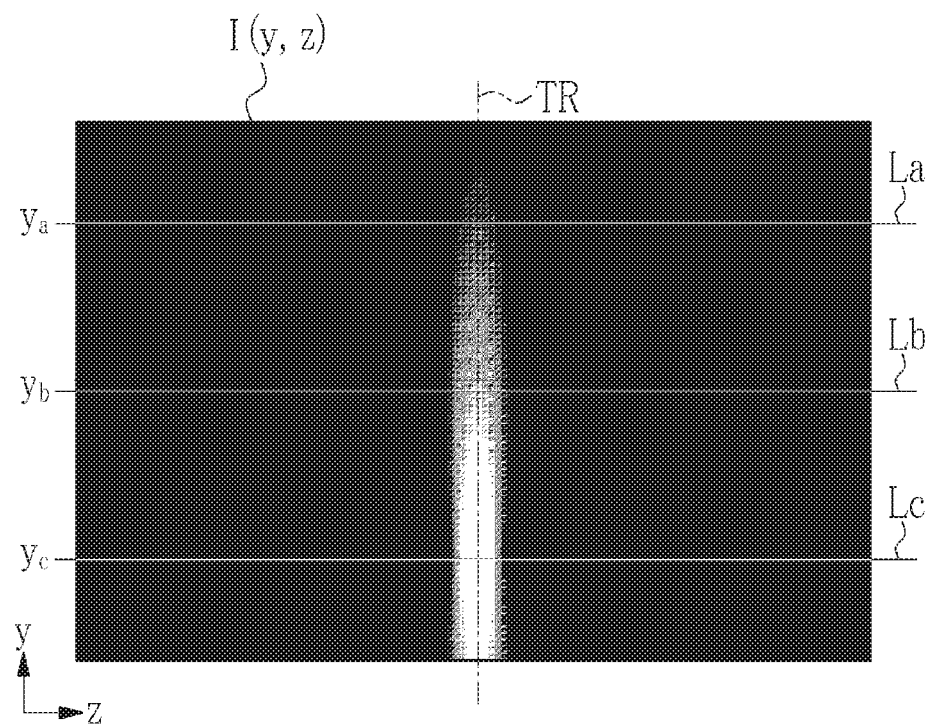
FIG. 16 is a diagram illustrating an example of image data I (y, z) output from an image capturing unit 62 according to a second embodiment.

FIG. 16 is a diagram illustrating an example of image data I (y, z) output from the image capturing unit 62 according to the second embodiment. In the second embodiment, the correlation search processing unit 71 included in the movement amount determination unit 64 performs a one-dimensional correlation search process along a plurality of lines orthogonal to the y-direction. For example, as illustrated in FIG. 16, the correlation search processing unit 71 performs the correlation search process along a first line La whose y coordinate position is $y_a$, a second line Lb whose y coordinate position is $y_b$, and a third line Lc whose y coordinate position is $y_c$. The second line Lb passes through the center of the image data I(y, z) corresponding to the plasma generation region 25.

In the second embodiment, the normalized correlation search process by the correlation search processing unit 71 is performed on the basis of the following expression (3), for example.

$$\gamma(y_i, z_s) = \frac{\int ((I(y_i, z) - I_{av})(T(z - z_s) - T_{av}))dz}{\sqrt{\int (I(y_i, z) - I_{av})^2 dz} \sqrt{\int (T(z - z_s) - T_{av})^2 dz}} \quad (3)$$

Figure 17:
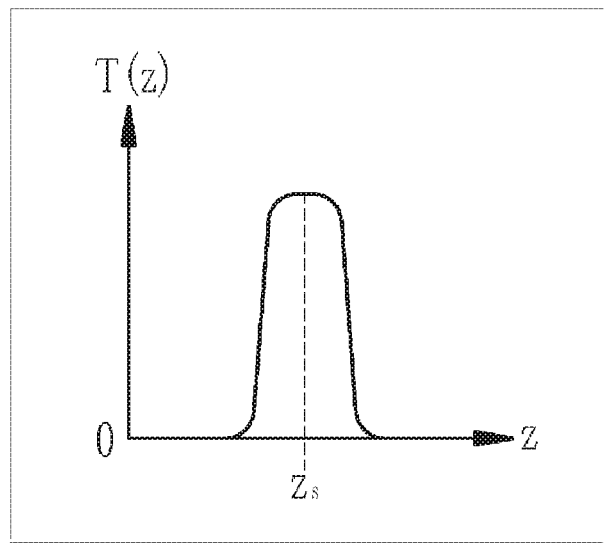
FIG. 17 is a diagram illustrating an example of template data T(z) stored in a template storage unit 70 according to the second embodiment.

FIG. 17 is a diagram illustrating an example of template data T(z) stored in the template storage unit 70 according to the second embodiment. The template data T(z) represents the luminance distribution of a part in the focused state in the z-direction in the linear image of the target 27. The sign $z_s$ indicates the center position of the template data T(z). The correlation search processing unit 71 calculates the normalized correlation value $\gamma(y_i, z_s)$ while changing the center position $z_s$ using the template data T(z). $y_i$ indicates the y coordinate position where the correlation search process is performed. Hereinafter, $\gamma(y_i, z_s)$ is simply represented as γ(y, z).

Figure 18:
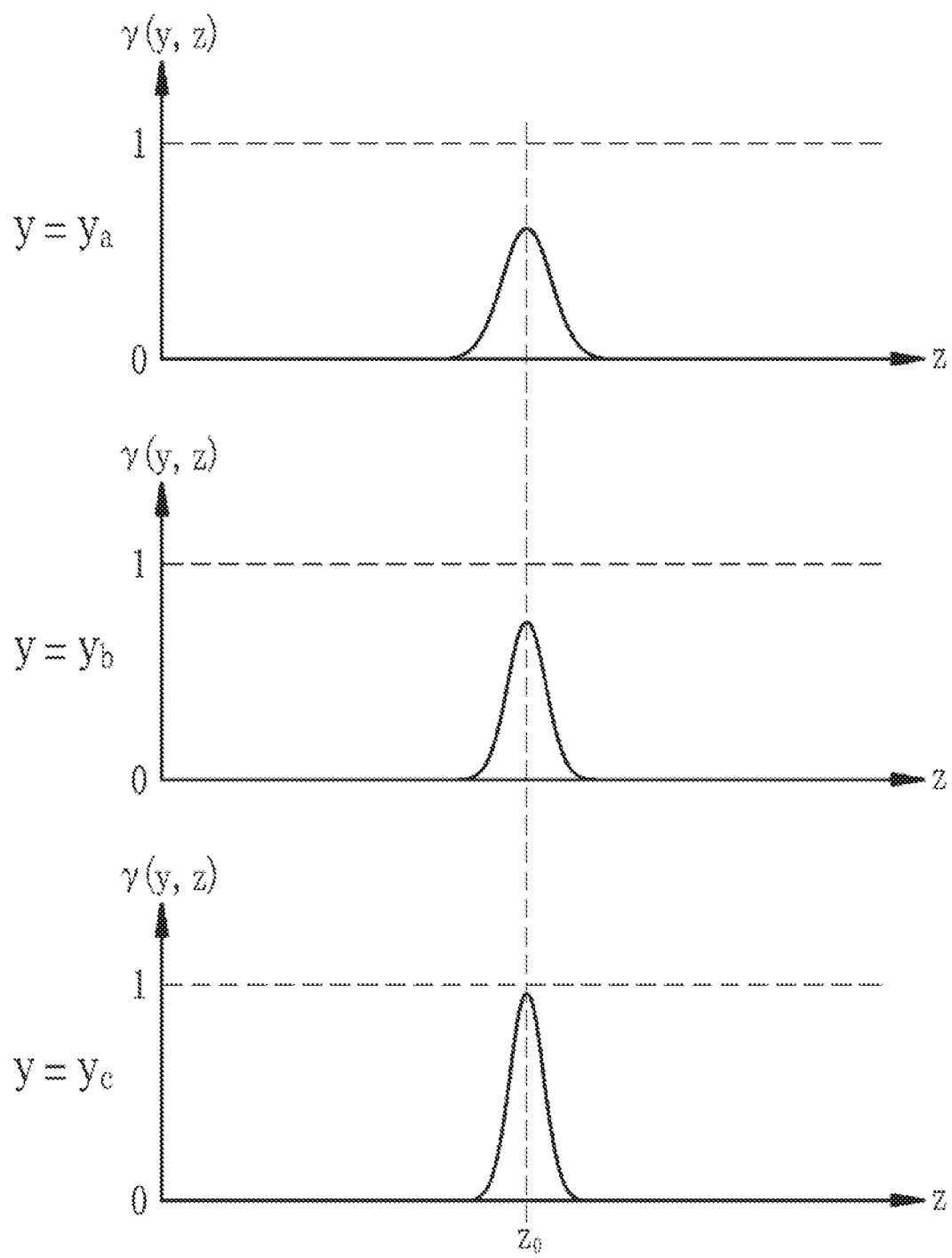
FIG. 18 is a diagram illustrating an example of normalized correlation values γ(y, z) obtained along first to third lines La to Lc.
Figure 19:
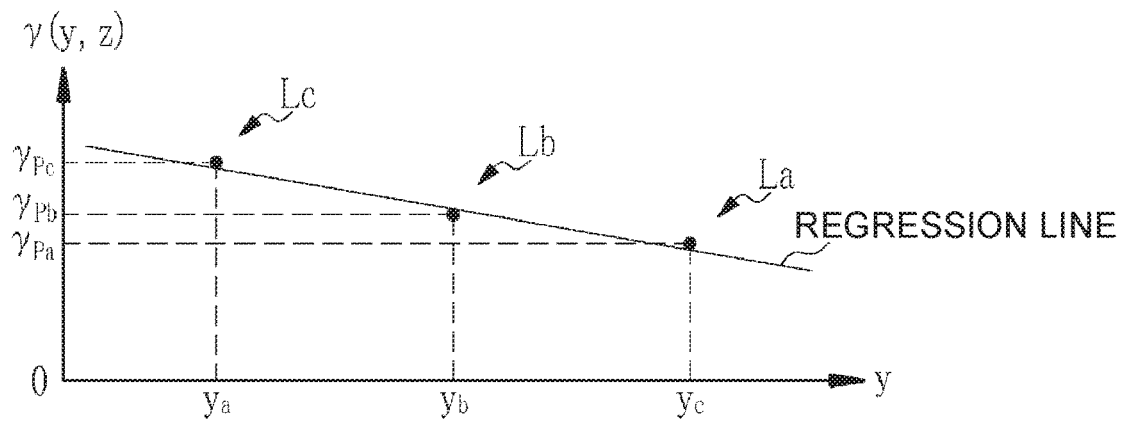
FIG. 19 is a diagram illustrating an example of peak values of the normalized correlation values γ(y, z)

FIG. 18 is a diagram illustrating an example of normalized correlation values γ(y, z) obtained along the first to third lines La to Lc. In the second embodiment, the correlation search processing unit 71 obtains the peak value and the peak position on the basis of the normalized correlation value γ(y, z). Each peak value of the normalized correlation value γ(y, z) obtained along the first to third lines La to Lc becomes the highest on the line passing through a part having the highest contrast in the linear image of the target 27 illustrated in FIG. 16. FIG. 19 illustrates each of the peak values $\gamma_{Pa}$, $\gamma_{Pb}$ and $\gamma_{Pc}$ of the normalized correlation values γ(y, z).

The regression coefficient calculating unit 72 calculates the regression coefficient on the basis of the peak values and the peak positions calculated by the correlation search processing unit 71. More specifically, the regression coefficient calculating unit 72 calculates the regression coefficient θ on the basis of the following expression (4).

$$\theta = \frac{\sum_i (y_i - y_{av})(\gamma_{Pi} - \gamma_{av})}{\sum_i (y_{Pi} - y_{av})^2} \quad (4)$$

Here, $\gamma_{av}$ is the average value of the peak values $\gamma_{Pi}$ of the normalized correlation values γ(y, z). $y_{av}$ is the average value of the coordinate positions $y_i$ on the line to which the correlation search process is performed, that is, the average value of the peak positions with respect to the y-direction.

In the example of FIG. 19, the regression coefficient θ is negative. The negative value of the regression coefficient θ indicates that the focus of the image capturing unit 62 is made on the downstream of the trajectory TR. As with the first embodiment, the movement amount calculating unit 73 calculates the movement amount of the sensor stage 62h required to cause the image capturing position of the image capturing unit 62 to coincide substantially with the plasma generation region 25, on the basis of the regression coefficient θ calculated by the regression coefficient calculating unit 72.

The other configuration points and operations are analogous to those of the first embodiment. The second embodiment describes the example of calculating the normalized correlation value γ(y, z) along three lines in the z-direction with different y coordinate positions, but the number of lines is not limited to "3" and is allowed to be any number of two or more.

5.2 Effect

In the second embodiment, by increasing the number of lines where the aforementioned correlation search process is performed, the movement amount of the sensor stage 62h can be more accurately determined. Further, in the second embodiment, the actual trajectory of the target 27 can be accurately obtained from the peak position of the normalized correlation value γ(y, z) obtained on each line.

6. Third Embodiment

Next, an EUV light generation system that includes an EUV light generation device according to a third embodiment of the present disclosure is described. In the description below, elements substantially identical to the constituent elements of the EUV light generation system that includes the EUV light generation device of the aforementioned comparative example or the first embodiment are assigned the identical signs, and the description thereof is appropriately omitted.

In the first embodiment, the position of the plasma generation region 25 is fixed. However, the position of the plasma generation region 25 is sometimes changed by control from the exposure device 6. As the third embodiment, the EUV light generation system in a case where the position of the plasma generation region 25 is changed is described.

6.1 Configuration
6.1.1 Control System

Figure 20:
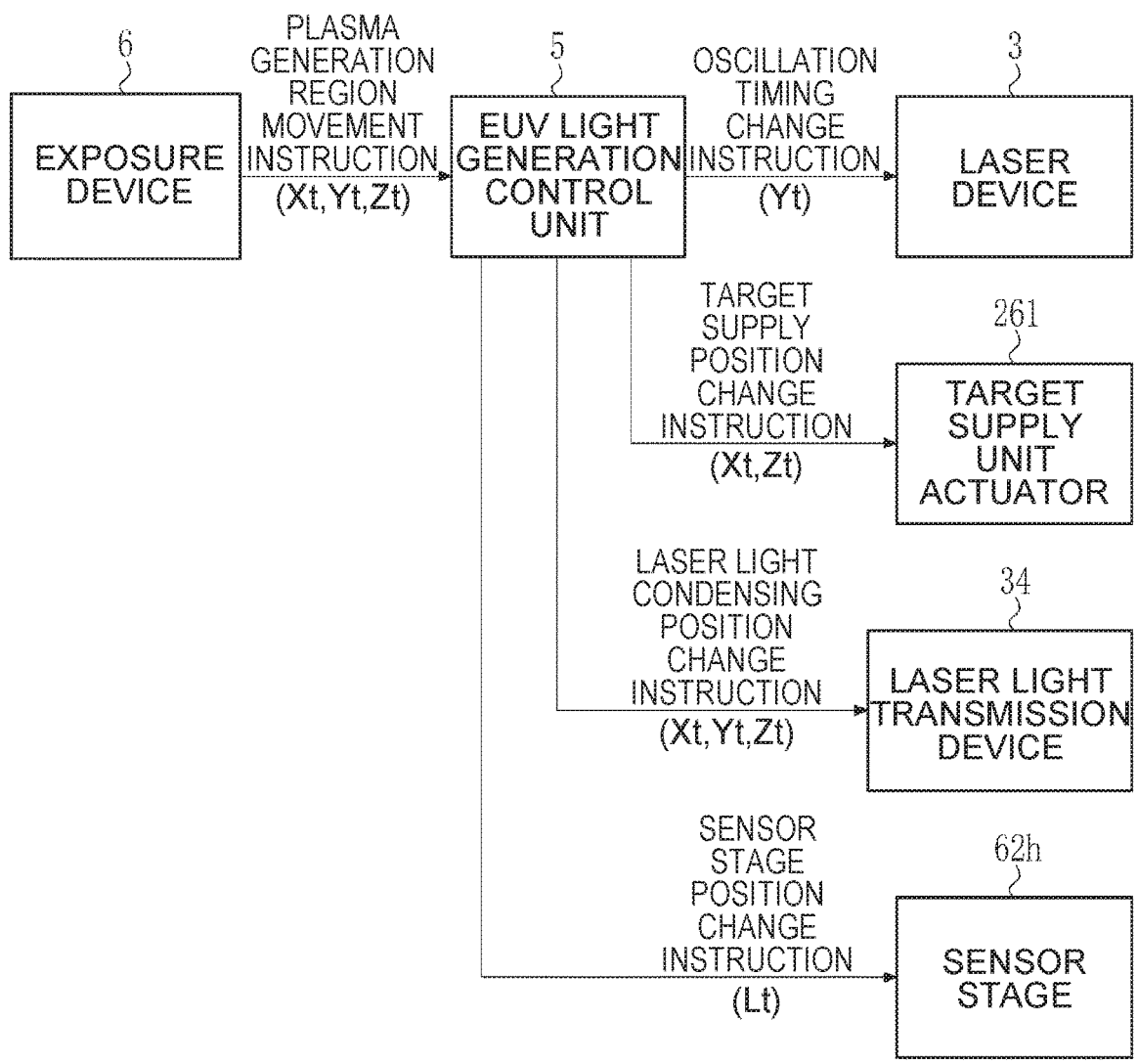
FIG. 20 is a diagram illustrating a control system of an EUV light generation system in a case where a plasma generation region 25 is moved in a third embodiment.

FIG. 20 is a diagram illustrating a control system of the EUV light generation system in the case where the plasma generation region 25 is moved in the third embodiment. The EUV light generation control unit 5 included in the EUV light generation device according to the third embodiment receives an instruction signal for moving the plasma generation region 25, from the exposure device 6 that is an external device with respect to the EUV light generation control unit 5. The instruction signal for movement in the plasma generation region 25 includes information that indicates the amounts of movement of the plasma generation region 25 in the X-direction, Y-direction and Z-direction, or the movement destination coordinate position of the plasma generation region 25. Here, as an example, it is assumed that the plasma generation region 25 is moved to the coordinate position (Xt, Yt, Zt).

Upon receipt, from the exposure device 6, of the instruction signal for moving the plasma generation region 25, the EUV light generation control unit 5 moves the plasma generation region 25 by changing the target position and the laser light condensing position, as described below.

The EUV light generation control unit 5 controls the laser device 3 to change the Y-direction position of the target 27 at a predetermined timing to the coordinate position Yt. That is, the EUV light generation control unit 5 adjusts the delay time for the laser device 3 outputting the pulse laser light 31, by transmitting an oscillation timing change instruction to the laser device 3.

The EUV light generation control unit 5 controls the target supply unit actuator 261 to change the position of the target 27 in the X-direction and the Z-direction to the coordinate position (Xt, Zt). That is, the EUV light generation control unit 5 transmits a target supply position change instruction to the target supply unit actuator 261, thereby moving the target supply unit 26 and moving the trajectory TR of the target 27. The target supply unit actuator 261 corresponds to the target trajectory change unit in the present disclosure.

The EUV light generation control unit 5 controls the laser light transmission device 34 to change the laser light condensing position to the coordinate position (Xt, Yt, Zt). That is, the EUV light generation control unit 5 changes the laser light condensing position by transmitting the laser light condensing position change instruction to the laser light transmission device 34. The laser light transmission device 34 corresponds to the condensing position change unit in the present disclosure.

Further, the EUV light generation control unit 5 calculates the movement amount Lt of the plasma generation region 25 along the image capturing direction of the image capturing unit 62 due to the movement of the plasma generation region 25 to the coordinate position (Xt, Yt, Zt). The EUV light generation control unit 5 changes the position of the sensor stage 62h along the image capturing direction, by transmitting the calculated movement amount Lt as the sensor stage position change instruction to the sensor stage 62h.

6.1.2 Image Capturing Unit and Illumination Unit

Figure 21:
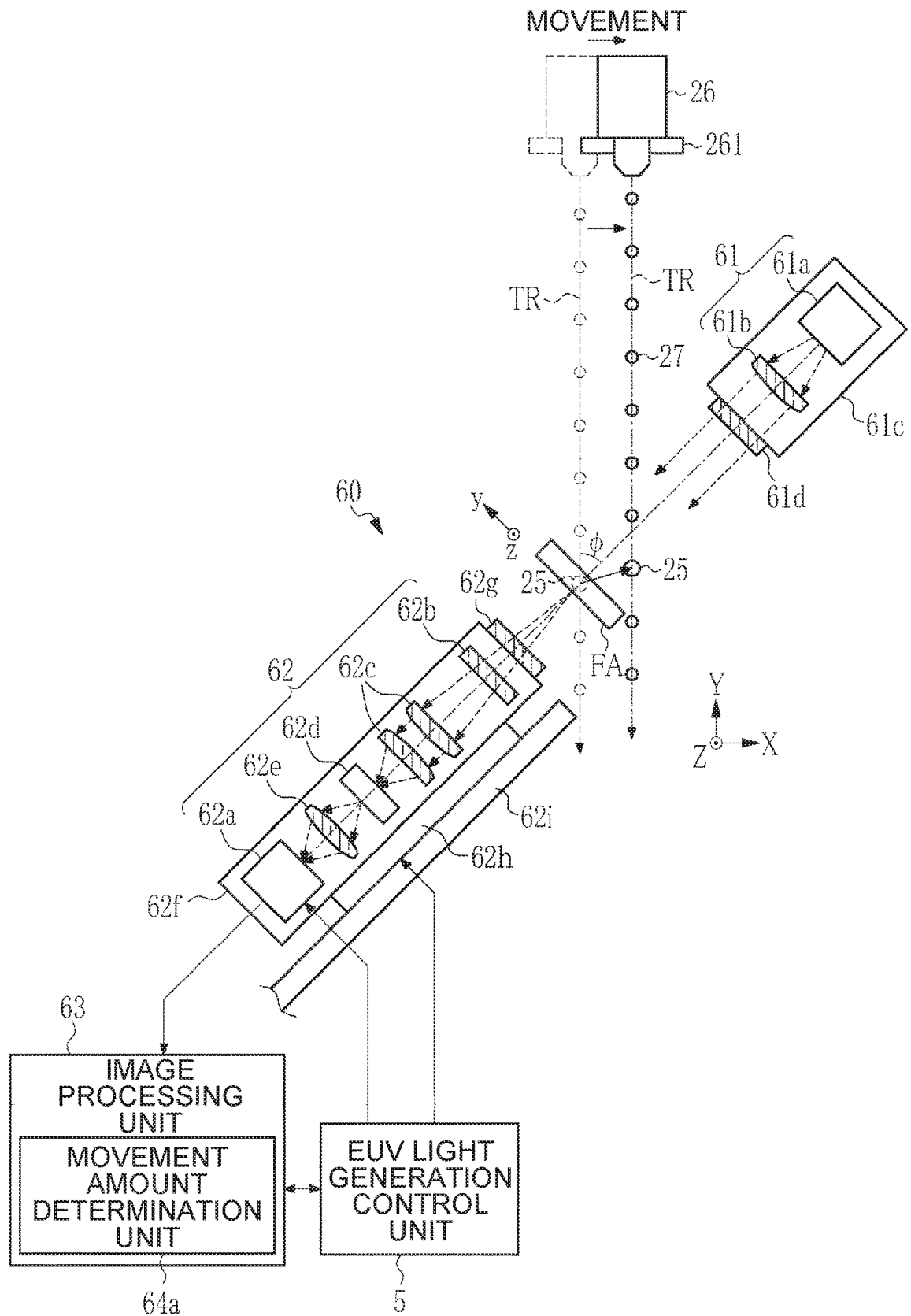
FIG. 21 is a diagram illustrating a configuration of a target image measurement device 60 according to the third embodiment.

FIG. 21 is a diagram illustrating the configuration of the target image measurement device 60 according to the third embodiment. The configurations of the illumination unit 61 and the image capturing unit 62 in the third embodiment are analogous to those in the first embodiment. The position of the plasma generation region 25 is changed by control of the EUV light generation control unit 5 according to the instruction from the exposure device 6 as described above.

Figure 22:
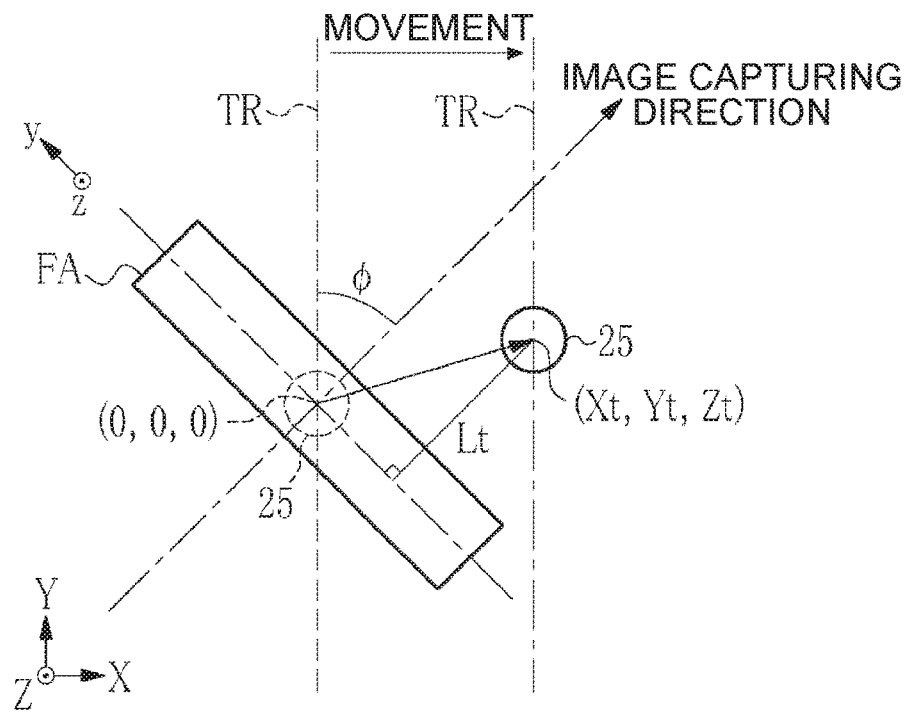
FIG. 22 is a diagram exemplifying coordinate positions of the plasma generation region 25 before and after movement.

FIG. 22 is a diagram exemplifying the coordinate positions of the plasma generation region 25 before and after movement. The EUV light generation control unit 5 assumes that the initial coordinate position of the plasma generation region 25 positioned at the center of the focus area FA is (0, 0, 0) and the coordinate position after movement is (Xt, Yt, Zt). The EUV light generation control unit 5 calculates the aforementioned movement amount Lt on the basis of the following expression (5) derived from the geometrical relationship illustrated in FIG. 22.

$$L_t = Y_t \cos \varphi + X_t \sin \varphi \quad (5)$$

The EUV light generation control unit 5 moves the sensor stage 62h so that the coordinate position (Xt, Yt, Zt) after movement can be included in the focus area FA of the image capturing unit 62, on the basis of the calculated movement amount Lt. In this way, the image of the target 27 can be sharply captured in the plasma generation region 25 by moving the image capturing position according to the movement of the plasma generation region 25. However, even if the image capturing position is moved according to the movement of the plasma generation region 25, the image capturing position can vary thereafter. As with the case of the first embodiment, the variation in image capturing position is caused by variations in the refractive indices of optical elements, such as the window 62g and the imaging optical system 62c, owing to heat application by scattering light of the EUV light and the pulse laser light 33, for example.

Accordingly, also in the third embodiment, the image capturing position of the image capturing unit 62 is changed on the basis of the image data obtained by capturing in the direction inclined from the trajectory TR of the target 27.

6.1.3 Movement Amount Determination Unit

Figure 23:
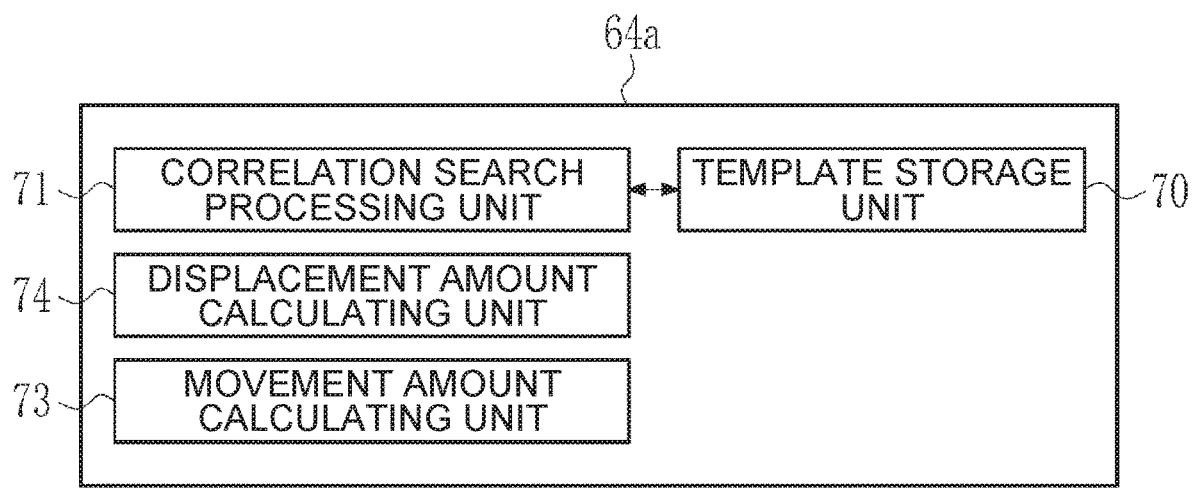
FIG. 23 is a diagram illustrating a configuration of a movement amount determination unit 64a included in an image processing unit 63 according to the third embodiment.

FIG. 23 is a diagram illustrating a configuration of a movement amount determination unit 64a included in an image processing unit 63 according to the third embodiment. The movement amount determination unit 64a in the third embodiment includes a displacement amount calculating unit 74 instead of the regression coefficient calculating unit 72 included in the movement amount determination unit 64 in the first embodiment. The movement amount determination unit 64a in the third embodiment includes a template storage unit 70, a correlation search processing unit 71, a displacement amount calculating unit 74, and a movement amount calculating unit 73.

As with the case of the first embodiment, the correlation search processing unit 71 performs the normalized correlation search process by using the focused image stored in the template storage unit 70 as the template, on the basis of the aforementioned expression (1). In the third embodiment, it is preferable that about five images of the targets 27 be captured in the image data I(y, z).

Figure 24:
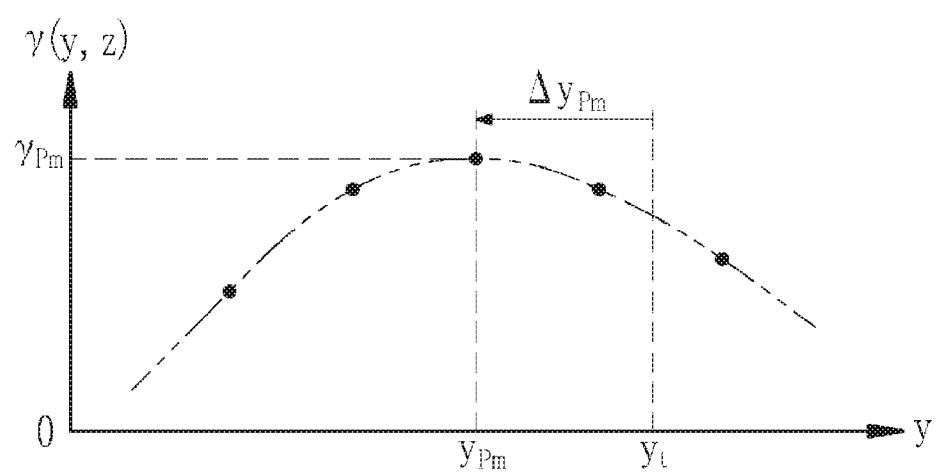
FIG. 24 is a diagram exemplifying a peak value of normalized correlation values γ(y, z) calculated for an image of each target 27 by a correlation search processing unit 71.

FIG. 24 is a diagram exemplifying the peak value of normalized correlation values $\gamma(y, z)$ calculated for the image of each target 27 by the a correlation search processing unit 71. The displacement amount calculating unit 74 obtains the maximum correlation position $y_{Pm}$ of the normalized correlation value $\gamma(y, z)$, and calculates the displacement amount $\Delta y_{Pm}$ of the maximum correlation position $y_{Pm}$ from the position $y_t$ corresponding to the plasma generation region 25. The maximum correlation position $y_{Pm}$ is the y coordinate position corresponding to the maximum value $\gamma_{Pm}$ of the normalized correlation value $\gamma(y, z)$.

More specifically, the displacement amount calculating unit 74 calculates the position $y_t$ corresponding to the plasma generation region 25 on the basis of the following expression (6). The position $y_t$ is the y coordinate position of the plasma generation region 25 in the image data I(y, z).

$$y_t = Y_t \sin \varphi - X_t \cos \varphi \quad (6)$$

Further, the displacement amount calculating unit 74 calculates the displacement amount $\Delta y_{Pm}$ on the basis of the following expression (7).

$$\Delta y_{Pm} = y_t - y_{Pm} \quad (7)$$

In the third embodiment, the movement amount calculating unit 73 calculates the movement amount of the sensor stage 62h required to cause the image capturing position of the image capturing unit 62 to coincide substantially with the plasma generation region 25, on the basis of the displacement amount $\Delta y_{Pm}$ calculated by the displacement amount calculating unit 74.

More specifically, the movement amount calculating unit 73 determines whether the displacement amount $\Delta y_{Pm}$ is positive or negative. If the displacement amount $\Delta y_{Pm}$ is positive, the movement direction of the sensor stage 62h is defined as "positive direction". If the displacement amount $\Delta y_{Pm}$ is negative, the movement direction of the sensor stage 62h is defined as "negative direction". The positive direction is a direction that makes the image capturing unit 62 be closed to the plasma generation region 25. The negative direction is a direction that makes the image capturing unit 62 be away from the plasma generation region 25.

Further, the movement amount calculating unit 73 preliminarily stores the relationship between the deviation of the image capturing position of the image capturing unit 62 from the plasma generation region 25 and the absolute value of the displacement amount $\Delta y_{Pm}$, and calculates the movement distance of the sensor stage 62h on the basis of the absolute value of the displacement amount $\Delta y_{Pm}$.

6.2 Operation

Figure 25:
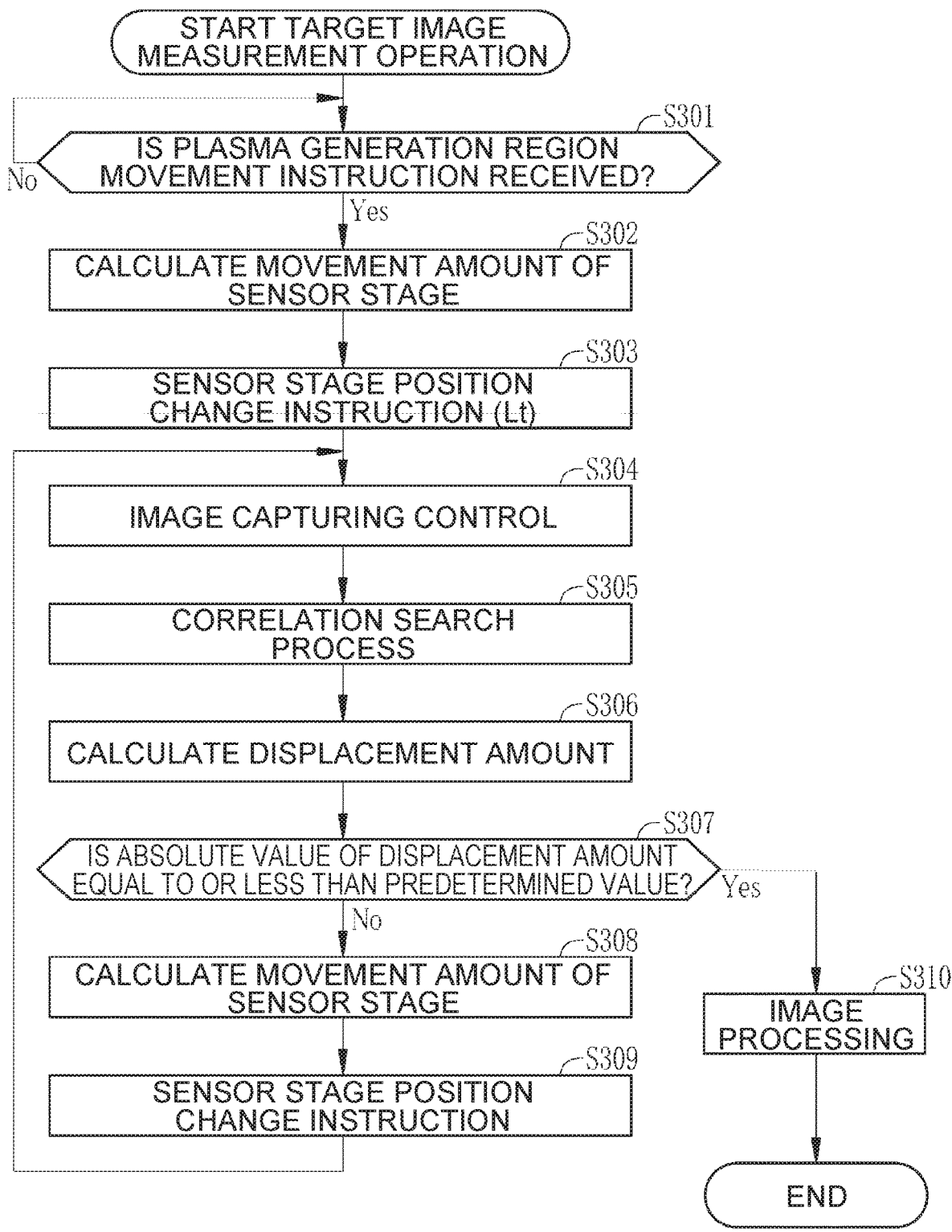
FIG. 25 is a flowchart illustrating a target image measurement operation for an EUV light generation device according to the third embodiment.

FIG. 25 is a flowchart illustrating a target image measurement operation for the EUV light generation device according to the third embodiment. The EUV light generation device performs the target image measurement operation according to the following process. First, in S301, the EUV light generation control unit 5 waits for a movement instruction signal for the plasma generation region 25 to be output from the exposure device 6. Next, in S302, when the EUV light generation control unit 5 receives the movement instruction signal for the plasma generation region 25 from the exposure device 6 (S301; Yes), this unit moves the plasma generation region 25 according to the movement instruction signal, and calculates the movement amount Lt of the plasma generation region 25 along the image capturing direction. The plasma generation region 25 is moved by the EUV light generation control unit 5 controlling the laser device 3, the target supply unit actuator 261, and the laser light transmission device 34.

Next, in S303, the EUV light generation control unit 5 transmits a position change instruction signal to the sensor stage 62h on the basis of the calculated movement amount Lt. Upon receipt of the position change instruction signal, the sensor stage 62h is moved to a position allowing the moved plasma generation region 25 to be included in the focus area FA. Even though the sensor stage 62h is moved according to the movement of the plasma generation region 25 as described above, the image capturing position of the image capturing unit 62 is varied by variation in the refractive index of the optical element and the like, and the plasma generation region 25 is out of the focus area FA, in some cases.

Subsequent S304 is performed in the rest period of the burst operation, for example. First, in S304, pulse illumination light is output by the illumination unit 61, and the images of the targets 27 irradiated with the illumination light are captured by the image capturing unit 62. Image data generated by the image capturing is input into the movement amount determination unit 64a.

Next, in S305, the normalized correlation search process is performed by the correlation search processing unit 71 by using the focused image of the target 27 preliminarily stored in the template storage unit 70 as a template. Further, the peak value of the normalized correlation values $\gamma(y, z)$ and the peak position that correspond to each target 27 captured by the image capturing unit 62 are calculated by the correlation search processing unit 71.

Next, in S306, the maximum correlation position $y_{Pm}$ of the normalized correlation value $\gamma(y, z)$, and the position $y_t$ corresponding to the plasma generation region 25 in the image data I(y, z) are obtained by the displacement amount calculating unit 74, and the displacement amount $\Delta y_{Pm}$ is calculated. In S307, it is determined, by the EUV light generation control unit 5, whether the absolute value of the displacement amount $\Delta y_{Pm}$ calculated by the displacement amount calculating unit 74 is equal to or less than a predetermined value or not. If it is determined that the absolute value of the displacement amount $\Delta y_{Pm}$ is larger than the predetermined value (S307; No), the processing transitions to S308. In S308, the movement amount of the sensor stage 62h is calculated by the movement amount calculating unit 73 on the basis of the displacement amount $\Delta y_{Pm}$.

Next, in S309, the EUV light generation control unit 5 outputs a position change instruction to the sensor stage 62h on the basis of the movement amount determined by the movement amount determination unit 64a, and moves the sensor stage 62h. For example, as illustrated in FIG. 24, if the displacement amount $\Delta y_{Pm}$ is positive, the sensor stage 62h is moved in the positive direction by a distance according to the absolute value of the displacement amount $\Delta y_{Pm}$.

Subsequently, the processing returns to S304, and the operation of the aforementioned S304 to S307 is performed. In S307, if it is determined that the absolute value of the displacement amount $\Delta y_{Pm}$ is equal to or less than the predetermined value (S307; Yes), the processing transitions to S310. In S310, an image processing analogous to that in the first embodiment is performed.

6.3 Effect

According to the third embodiment, even when the plasma generation region 25 is moved, the image of the target 27 can be sharply captured and the EUV light generation can be stabilized.

7. Fourth Embodiment

Next, an EUV light generation system that includes an EUV light generation device according to a fourth embodiment of the present disclosure is described. In the description below, elements substantially identical to the constituent elements of the EUV light generation system that includes the EUV light generation device of the aforementioned comparative example or the second embodiment are assigned the identical signs, and the description thereof is appropriately omitted.

In the second embodiment, the position of the plasma generation region 25 is fixed. However, the position of the plasma generation region 25 is sometimes changed by control from the exposure device 6. As the fourth embodiment, the EUV light generation system in a case where the position of the plasma generation region 25 is changed is described.

7.1 Configuration and Operation 7.1.1 Control System

The control system of the EUV light generation device according to the fourth embodiment is analogous to the control system of the third embodiment illustrated in FIG. 20. Upon receipt, from the exposure device 6, of the instruction signal for moving the plasma generation region 25, the EUV light generation control unit 5 moves the plasma generation region 25 by changing the target position and the laser light condensing position, as described below.

Further, the EUV light generation control unit 5 calculates the movement amount Lt of the plasma generation region 25 along the image capturing direction of the image capturing unit 62 due to the movement of the plasma generation region 25 to the coordinate position (Xt, Yt, Zt). The EUV light generation control unit 5 changes the position of the sensor stage 62h along the image capturing direction, by transmitting the calculated movement amount Lt as the sensor stage position change instruction to the sensor stage 62h.

7.1.2 Image Capturing Unit and Illumination Unit

Figure 26:
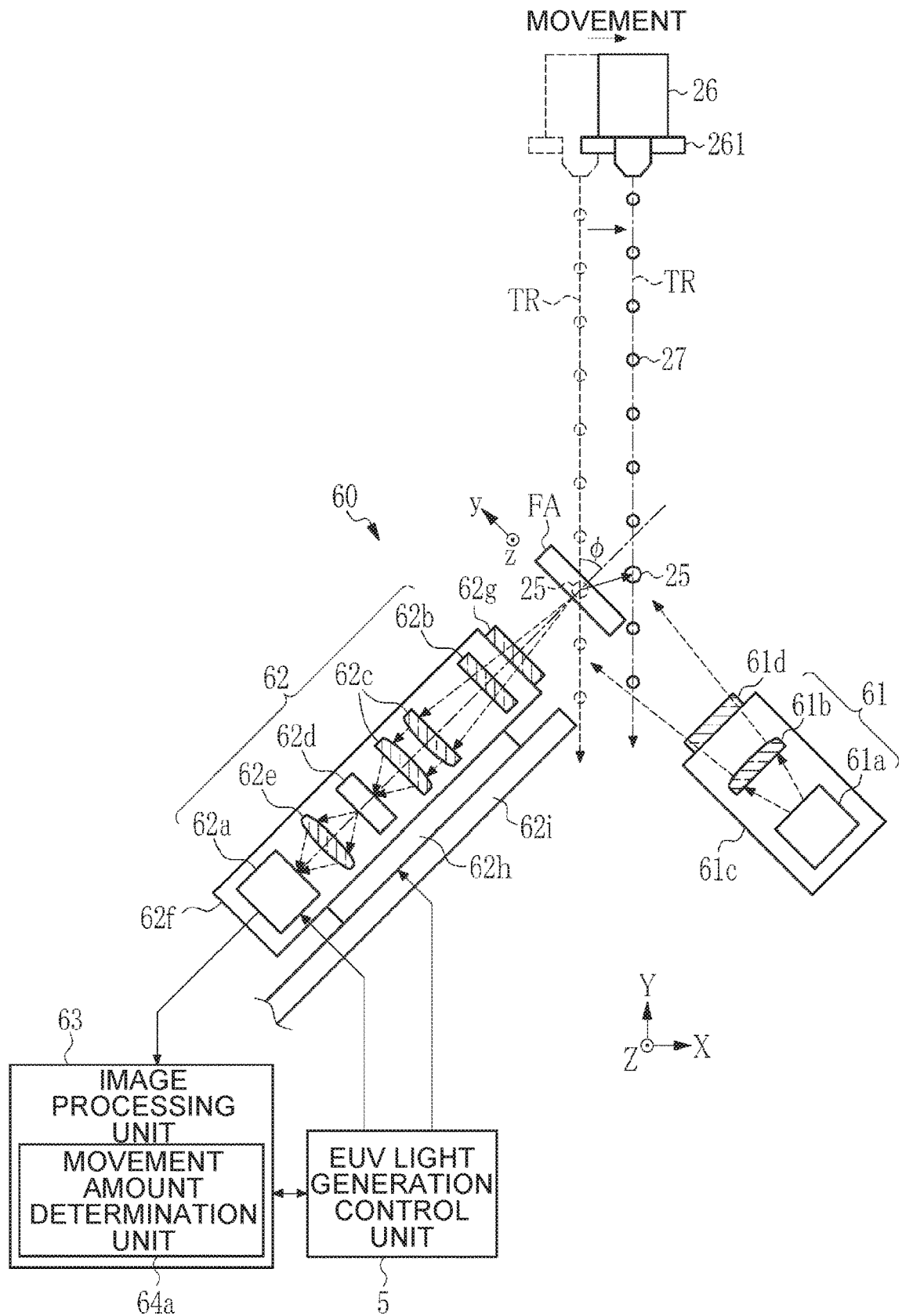
FIG. 26 is a diagram illustrating a configuration of a target image measurement device 60 according to a fourth embodiment.

FIG. 26 is a diagram illustrating the configuration of the target image measurement device 60 according to the fourth embodiment. The configurations of the illumination unit 61 and the image capturing unit 62 in the fourth embodiment are analogous to those in the second embodiment. The position of the plasma generation region 25 is changed by control of the EUV light generation control unit 5 according to the instruction from the exposure device 6 as described above. The EUV light generation control unit 5 calculates the movement amount Lt in a manner analogous to that in the third embodiment, and moves the sensor stage 62h so that the coordinate position (Xt, Yt, Zt) after movement can be included in the focus area FA of the image capturing unit 62, on the basis of the calculated movement amount Lt.

7.1.3 Movement Amount Determination Unit

The configuration of the movement amount determination unit 64a included in the image processing unit 63 according to the fourth embodiment is analogous to the configuration of the movement amount determination unit 64a of the third embodiment illustrated in FIG. 23. However, the correlation search processing unit 71 performs the correlation search process based on the aforementioned expression (3) as with the second embodiment. In the fourth embodiment, it is preferable that the number of lines subjected to the correlation search be about five.

The displacement amount calculating unit 74 obtains the maximum correlation position $y_{Pm}$ of the normalized correlation value $\gamma(y, z)$, calculated based on the aforementioned expression (3), and calculates the displacement amount $\Delta y_{Pm}$ of the maximum correlation position $y_{Pm}$ from the position $y_t$ corresponding to the plasma generation region 25. The position $y_t$ is calculated based on the aforementioned expression (6). Further, the displacement amount calculating unit 74 calculates the displacement amount $\Delta y_{Pm}$ on the basis of the aforementioned expression (7).

The movement amount calculating unit 73 calculates the movement amount of the sensor stage 62h required to cause the image capturing position of the image capturing unit 62 to coincide substantially with the plasma generation region 25, on the basis of the displacement amount $\Delta y_{Pm}$ calculated by the displacement amount calculating unit 74.

The other configuration points and operations of the EUV light generation device in the fourth embodiment are analogous to the configuration points and operations of the EUV light generation device in the third embodiment.

8. Modification Example 8.1 Image Capturing Direction of Image Capturing Unit In the first to fourth embodiments, the image capturing direction of the image capturing unit 62 is non-orthogonal and non-parallel to the trajectory TR of the target 27 and is parallel to the XY plane. The direction is not limited thereto, and may be non-parallel to the XY plane. For example, the image capturing direction of the image capturing unit 62 may be non-orthogonal and non-parallel to the trajectory TR of the target 27 and parallel to the YZ plane.

8.2 Image Capturing Unit and Illumination Unit

In the first to fourth embodiments, only one set of the illumination unit 61 and the image capturing unit 62 is provided. Alternatively, a plurality of sets of illumination units 61 and image capturing units 62 may be provided. In this case, it is preferable that the image capturing directions of the image capturing units 62 be directions different from each other. Thereby, the images of the target 27 can be captured in a plurality of directions.

8.3 Change in Image Capturing Position of Image Capturing Unit

In the first to fourth embodiments, the image capturing position of the image capturing unit 62 is changed by moving the sensor stage 62h that holds the housing 62f of the image capturing unit 62 in the image capturing direction. However, the configuration is not limited thereto. Alternatively, the image capturing position of the image capturing unit 62 may be changed by another mechanism. For example, the image capturing position of the image capturing unit 62 may be changed by moving only one or some optical elements in the housing 62f in the image capturing direction. In this way, in a case where one or some optical elements are moved without moving the entire image capturing unit 62, the ratio of the movement amount of the image capturing position to the movement amount of the optical element(s) to be moved needs to be considered.

Further, in the first to fourth embodiments, the image capturing unit 62 is moved by the sensor stage 62h, which is the linear actuator. However, the actuator for moving the image capturing unit 62 is not limited thereto. Alternatively, another actuator may be included.

8.4 Correlation Search Processing Unit and Control Unit

The EUV light generation control unit 5, the signal processing unit 53 and the image processing unit 63 in the first to fourth embodiments may be made up of a general-purpose control device, such as a computer or a programmable controller. The template storage unit 70, the correlation search processing unit 71, the regression coefficient calculating unit 72, the movement amount calculating unit 73 and the displacement amount calculating unit 74 may be made up of an FPGA (Field-Programmable Gate Array), a custom chip or the like. Alternatively, the elements may be achieved by software that is stored in a storage device, such as a ROM (Read Only Memory) or a hard disk, not illustrated, and can be read as needed during execution.

The description provided above is intended to provide just examples without any limitations. Accordingly, it will be obvious to those skilled in the art that changes can be made to the embodiments of the present disclosure without departing from the scope of the accompanying claims.

The terms used in the present description and in the entire scope of the accompanying claims should be construed as terms "without limitations". For example, a term "including" or "included" should be construed as "not limited to that described to be included". A term "have" should be construed as "not limited to that described to be held". Moreover, a modifier "a/an" described in the present description and in the accompanying claims should be construed to mean "at least one" or "one or more".

What is claimed is:

1. An extreme ultraviolet light generation device comprising:
    a target supply unit configured to output a plurality of targets along a trajectory toward a plasma generation region;
    a laser device configured to emit laser light toward the plasma generation region;
    an image capturing unit having an image capturing direction non-orthogonal and non-parallel to the trajectory, the image capturing unit configured to capture an image of a region including the plasma generation region, and output image data;
    an illumination unit configured to output illumination light to the region including the plasma generation region;
    an image capturing position change unit configured to change an image capturing position of the image capturing unit along the image capturing direction;
    a movement amount determination unit configured to determine a movement amount of the image capturing position based on the image data; and
    a control unit configured to control the image capturing position change unit based on the movement amount determined by the movement amount determination unit.

2. The extreme ultraviolet light generation device according to claim 1, wherein
    a movement amount determination unit includes:
    a correlation search processing unit configured to apply correlation search to the image data by using a focused image of the target as a template and calculate a plurality of correlation values representing a similarity with the focused image; and
    a movement amount calculating unit configured to calculate the movement amount of the image capturing position based on the plurality of correlation values.

3. The extreme ultraviolet light generation device according to claim 2, wherein
    the illumination unit is disposed at a position facing the image capturing unit,
    the image capturing unit outputs the image data in which two or more images of the targets are simultaneously captured,
    the movement amount determination unit further includes a regression coefficient calculating unit configured to calculate a regression coefficient based on a peak value and a peak position of the correlation values, the peak value and the peak position corresponding to the respective targets image-captured by the image capturing unit, and
    the movement amount calculating unit calculates the movement amount based on the regression coefficient calculated by the regression coefficient calculating unit.

4. The extreme ultraviolet light generation device according to claim 3, wherein the illumination unit outputs pulse light as the illumination light.

5. The extreme ultraviolet light generation device according to claim 2, wherein
    the illumination unit is disposed at a position not facing the image capturing unit,
    the image capturing unit outputs the image data in which the images of the targets are captured linearly along the trajectory,
    the correlation search processing unit calculates the plurality of correlation values along a plurality of lines orthogonal to the linear images,
    the movement amount determination unit further includes a regression coefficient calculating unit configured to calculate a regression coefficient based on a peak value and a peak position of the plurality of correlation values obtained along the lines, and
    the movement amount calculating unit calculates the movement amount based on the regression coefficient calculated by the regression coefficient calculating unit.

6. The extreme ultraviolet light generation device according to claim 5, wherein the illumination unit outputs Continuous Wave light as the illumination light.

7. The extreme ultraviolet light generation device according to claim 2, further comprising:
    a target trajectory change unit configured to change the trajectory of the target; and
    a condensing position change unit configured to change a condensing position of the laser light, wherein
    the control unit controls the target trajectory change unit to change the trajectory based on a movement instruction signal for the plasma generation region, the movement instruction signal being received from an outside, and controls the condensing position change unit to change the condensing position.

8. The extreme ultraviolet light generation device according to claim 7, wherein
    the illumination unit is disposed at a position facing the image capturing unit, the image capturing unit outputs the image data in which two or more images of the targets are simultaneously captured, the movement amount determination unit further comprises a displacement amount calculating unit configured to obtain a maximum correlation position corresponding to a maximum value among the correlation values corresponding to the respective targets image-captured by the image capturing unit, and calculate a displacement amount of the maximum correlation position from a position corresponding to the plasma generation region, and the movement amount calculating unit calculates the movement amount based on the displacement amount calculated by the displacement amount calculating unit.

9. The extreme ultraviolet light generation device according to claim 8, wherein the illumination unit outputs pulse light as the illumination light.

10. The extreme ultraviolet light generation device according to claim 7, wherein the illumination unit is disposed at a position not facing the image capturing unit, the image capturing unit outputs the image data in which the images of the targets are captured linearly along the trajectory, the correlation search processing unit calculates the plurality of correlation values along a plurality of lines orthogonal to the linear images, the movement amount determination unit further comprises a displacement amount calculating unit configured to obtain a maximum correlation position corresponding to a maximum value among the plurality of correlation values obtained along the lines, and calculate a displacement amount of the maximum correlation position from a position corresponding to the plasma generation region, and the movement amount calculating unit calculates the movement amount based on the displacement amount calculated by the displacement amount calculating unit.

11. The extreme ultraviolet light generation device according to claim 10, wherein the illumination unit outputs Continuous Wave light as the illumination light.

12. The extreme ultraviolet light generation device according to claim 1, wherein the image capturing position change unit includes a linear actuator configured to move the image capturing unit along the image capturing direction.

13. The extreme ultraviolet light generation device according to claim 1, wherein an illumination direction of the illumination unit and the image capturing direction of the image capturing unit are opposite and parallel to each other.

14. The extreme ultraviolet light generation device according to claim 1, wherein the image capturing position change unit moves only one or some optical elements in the image capturing unit, and does not move rest of the optical elements.

* * * * *